(12) United States Patent
Fujiwara et al.

(10) Patent No.: US 9,384,083 B2
(45) Date of Patent: Jul. 5, 2016

(54) ERROR LOCATION SEARCH CIRCUIT, AND ERROR CHECK AND CORRECTION CIRCUIT AND MEMORY DEVICE INCLUDING THE SAME

(71) Applicant: Samsung Electronics Co., Ltd., Suwon-Si, Gyeonggi-Do (KR)

(72) Inventors: Daisuke Fujiwara, Yokohama (JP); Makoto Hirano, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 80 days.

(21) Appl. No.: 14/034,803

(22) Filed: Sep. 24, 2013

(65) Prior Publication Data

US 2014/0089768 A1 Mar. 27, 2014

(30) Foreign Application Priority Data

Sep. 24, 2012 (JP) ................................ 2012-209529
Sep. 24, 2012 (JP) ................................ 2012-209772
Aug. 13, 2013 (KR) ........................ 10-2013-0096080

(51) Int. Cl.
*H03M 13/00* (2006.01)
*G06F 11/10* (2006.01)
*H03M 13/07* (2006.01)
*H03M 13/15* (2006.01)

(52) U.S. Cl.
CPC ............... *G06F 11/10* (2013.01); *H03M 13/07* (2013.01); *H03M 13/158* (2013.01); *H03M 13/1545* (2013.01); *H03M 13/6561* (2013.01)

(58) Field of Classification Search
None
See application file for complete search history.

(56) References Cited

U.S. PATENT DOCUMENTS

| | | | | |
|---|---|---|---|---|
| 5,414,719 A * | 5/1995 | Iwaki et al. | | 714/785 |
| 5,642,367 A * | 6/1997 | Kao | | 714/784 |
| 6,378,104 B1 * | 4/2002 | Okita | | 714/784 |
| 6,550,035 B1 * | 4/2003 | Okita | | 714/774 |
| 6,721,919 B1 * | 4/2004 | Morioka et al. | | 714/801 |
| 7,406,651 B2 * | 7/2008 | Yoon | | 714/784 |
| 8,719,669 B2 * | 5/2014 | Kong et al. | | 714/772 |
| 2001/0052103 A1 | 12/2001 | Hirofuji et al. | | |
| 2009/0106634 A1 | 4/2009 | Muraoka | | |
| 2009/0217140 A1 * | 8/2009 | Jo et al. | | 714/785 |
| 2011/0072334 A1 * | 3/2011 | Brauchle et al. | | 714/781 |

FOREIGN PATENT DOCUMENTS

| | | |
|---|---|---|
| JP | 7-50595 A | 2/1995 |
| JP | 2000-307436 A | 11/2000 |
| JP | 2001-044853 A | 2/2001 |
| JP | 2001-203587 A | 7/2001 |
| JP | 2009-100369 A | 5/2009 |

* cited by examiner

Primary Examiner — Daniel McMahon
(74) Attorney, Agent, or Firm — Harness, Dickey & Pierce, P.L.C.

(57) ABSTRACT

Provided is an error check and correction (ECC) circuit which includes a Chien search unit configured to determine whether there is an error in a data string. The Chien search unit includes a circuit configured to calculate a first bit string by multiplying a plurality of elements of Galois Field $GF(2^n)$ and a value of (n-k)-bit, and calculate a second bit string by multiplying the plurality of elements and a value of k-bit; and a plurality of Chien search circuits configured to combine the first bit string and the second bit string to calculate the arbitrary element. The plurality of Chien search circuits are arranged in a matrix along a row direction and a column direction. The first bit string is provided in the row direction or the column direction, and the second bit string is provided in a direction different from the direction of the first bit string.

8 Claims, 24 Drawing Sheets

Fig. 2
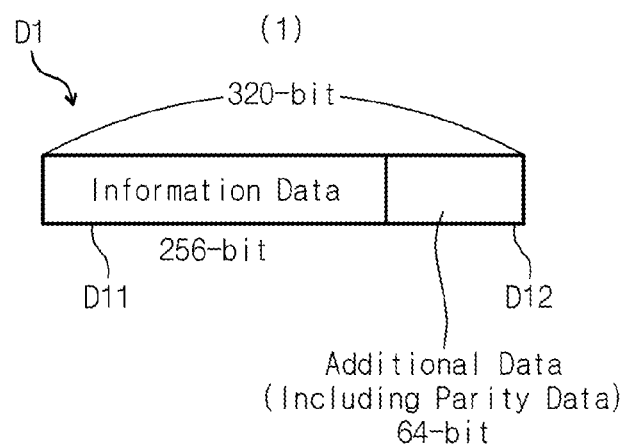
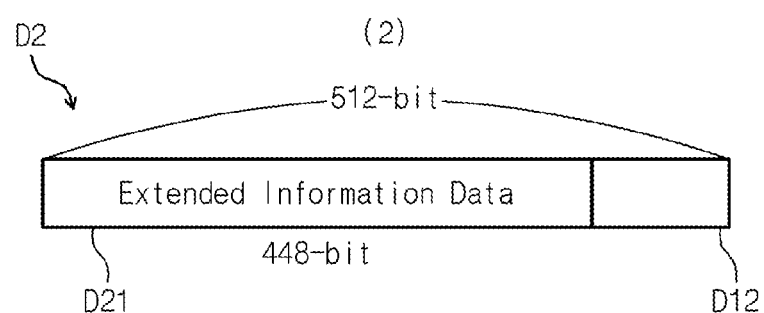
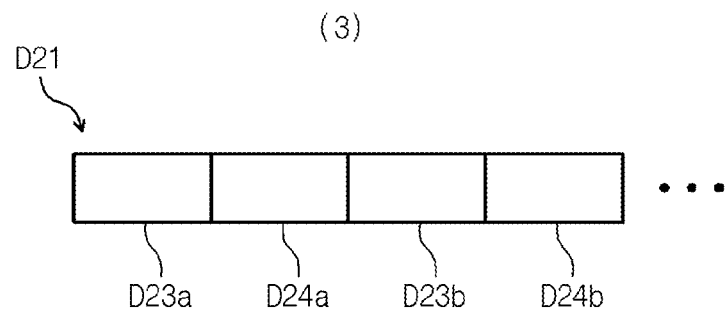

Fig. 7

| Power Expression | Polynomial Expression | Vector Expression |
|---|---|---|
| 0 | 0 | 0 0 0 0 0 0 0 0 0 |
| 1 | 1 | 0 0 0 0 0 0 0 0 1 |
| $\alpha$ | $\alpha$ | 0 0 0 0 0 0 0 1 0 |
| $\alpha^2$ | $\alpha^2$ | 0 0 0 0 0 0 1 0 0 |
| $\alpha^3$ | $\alpha^3$ | 0 0 0 0 0 1 0 0 0 |
| $\alpha^4$ | $\alpha^4$ | 0 0 0 0 1 0 0 0 0 |
| $\alpha^5$ | $\alpha^5$ | 0 0 0 1 0 0 0 0 0 |
| $\alpha^6$ | $\alpha^6$ | 0 0 1 0 0 0 0 0 0 |
| $\alpha^7$ | $\alpha^7$ | 0 1 0 0 0 0 0 0 0 |
| $\alpha^8$ | $\alpha^8$ | 1 0 0 0 0 0 0 0 0 |
| $\alpha^9$ | $\alpha^4$ 1 | 0 0 0 0 1 0 0 0 1 |
| $\alpha^{10}$ | $\alpha^5$ $\alpha$ | 0 0 0 1 0 0 0 1 0 |
| $\alpha^{11}$ | $\alpha^6$ $\alpha^2$ | 0 0 1 0 0 0 1 0 0 |
| $\alpha^{12}$ | $\alpha^7$ $\alpha^3$ | 0 1 0 0 0 1 0 0 0 |
| $\alpha^{13}$ | $\alpha^8$ $\alpha^4$ | 1 0 0 0 1 0 0 0 0 |
| $\alpha^{14}$ | $\alpha^5$ $\alpha^4$ 1 | 0 0 0 1 1 0 0 0 1 |
| $\alpha^{15}$ | $\alpha^6$ $\alpha^5$ $\alpha$ | 0 0 1 1 0 0 0 1 0 |
| $\alpha^{16}$ | $\alpha^7$ $\alpha^6$ $\alpha^2$ | 0 1 1 0 0 0 1 0 0 |
| ⋮ | ⋮ | ⋮ |
| $\alpha^{510}$ | $\alpha^8$ $\alpha^3$ | 1 0 0 0 0 1 0 0 0 |

$S0 = \alpha^0 = 1$
$S1 = \alpha^1 = \alpha$
$S2 = \alpha^2$
$S3 = \alpha^3$
$S4 = \alpha^4$
$S5 = \alpha^5$
$S6 = \alpha^6$
$S7 = \alpha^7$
$S8 = \alpha^8$ (2)

$dp0 = 0$
$dp1 = p1[4] \cdot S4 + p1[5] \cdot S5 + p1[6] \cdot S6 + p1[7] \cdot S7 + p1[8] \cdot S8$
$dp2 = p2[4] \cdot S4 + p2[5] \cdot S5 + p2[6] \cdot S6 + p2[7] \cdot S7 + p2[8] \cdot S8$
⋮

(3)

$dq0 = 0$
$dq1 = q1[3] \cdot S3 + q1[2] \cdot S2 + q1[1] \cdot S1 + q1[0] \cdot S0$
$dq2 = q2[3] \cdot S3 + q2[2] \cdot S2 + q2[1] \cdot S1 + q2[0] \cdot S0$
⋮

| | bit | | | | |
|---|---|---|---|---|---|
| | 8 | 7 | 6 | 5 | 4 |
| p0 | 0 | 0 | 0 | 0 | 0 |
| p1 | 0 | 0 | 0 | 0 | 1 |
| p2 | 0 | 0 | 0 | 1 | 0 |
| p3 | 0 | 0 | 0 | 1 | 1 |
| p4 | 0 | 0 | 1 | 0 | 0 |
| p5 | 0 | 0 | 1 | 0 | 1 |
| p6 | 0 | 0 | 1 | 1 | 0 |
| p7 | 0 | 0 | 1 | 1 | 1 |
| p8 | 0 | 1 | 0 | 0 | 0 |
| p9 | 0 | 1 | 0 | 0 | 1 |
| p10 | 0 | 1 | 0 | 1 | 0 |
| p11 | 0 | 1 | 0 | 1 | 1 |
| p12 | 0 | 1 | 1 | 0 | 0 |
| p13 | 0 | 1 | 1 | 0 | 1 |
| p14 | 0 | 1 | 1 | 1 | 0 |
| p15 | 0 | 1 | 1 | 1 | 1 |
| ⋮ | ⋮ | | | | |
| p30 | 1 | 1 | 1 | 1 | 0 |
| p31 | 1 | 1 | 1 | 1 | 1 |

(2)

| | bit | | | |
|---|---|---|---|---|
| | 3 | 2 | 1 | 0 |
| q0 | 0 | 0 | 0 | 0 |
| q1 | 0 | 0 | 0 | 1 |
| q2 | 0 | 0 | 1 | 0 |
| q3 | 0 | 0 | 1 | 1 |
| q4 | 0 | 1 | 0 | 0 |
| q5 | 0 | 1 | 0 | 1 |
| q6 | 0 | 1 | 1 | 0 |
| q7 | 0 | 1 | 1 | 1 |
| q8 | 1 | 0 | 0 | 0 |
| q9 | 1 | 0 | 0 | 1 |
| q10 | 1 | 0 | 1 | 0 |
| q11 | 1 | 0 | 1 | 1 |
| q12 | 1 | 1 | 0 | 0 |
| q13 | 1 | 1 | 0 | 1 |
| q14 | 1 | 1 | 1 | 0 |
| q15 | 1 | 1 | 1 | 1 |

|  | x[319] | x[318] | ... | x[40] | x[39] | x[38] | x[37] | x[36] | x[35] | x[34] | x[33] | x[32] | ... | x[3] | x[2] | x[1] | x[0] |
|---|---|---|---|---|---|---|---|---|---|---|---|---|---|---|---|---|---|
| e[0] | 1 | 0 | ... | 1 | 1 | 0 | 1 | 0 | 0 | 0 | 0 | 0 | ... | 0 | 0 | 0 | 0 |
| e[1] | 0 | 0 | ... | 1 | 0 | 1 | 0 | 0 | 0 | 0 | 0 | 0 | ... | 0 | 0 | 0 | 0 |
| e[2] | 0 | 0 | ... | 0 | 1 | 0 | 1 | 0 | 0 | 0 | 0 | 0 | ... | 0 | 0 | 0 | 0 |
| e[3] | 1 | 0 | ... | 0 | 0 | 1 | 0 | 0 | 0 | 0 | 0 | 1 | ... | 0 | 0 | 0 | 0 |
| e[4] | 1 | 1 | ... | 0 | 1 | 0 | 1 | 0 | 0 | 0 | 1 | 0 | ... | 0 | 0 | 0 | 0 |
| e[5] | 1 | 0 | ... | 0 | 0 | 0 | 0 | 0 | 1 | 0 | 0 | 0 | ... | 0 | 0 | 0 | 0 |
| ... | ... | ... | ... | ... | ... | ... | ... | ... | ... | ... | ... | ... | ... | ... | ... | ... | ... |
| e[32] | 0 | 0 | ... | 0 | 0 | 1 | 0 | 0 | 0 | 0 | 0 | 0 | ... | 0 | 0 | 0 | 1 |
| e[33] | 1 | 0 | ... | 1 | 1 | 0 | 0 | 1 | 0 | 0 | 0 | 0 | ... | 0 | 0 | 1 | 0 |
| e[34] | 0 | 0 | ... | 0 | 0 | 1 | 0 | 1 | 0 | 0 | 0 | 0 | ... | 0 | 1 | 0 | 0 |
| e[35] | 1 | 1 | ... | 0 | 0 | 0 | 1 | 1 | 0 | 0 | 0 | 0 | ... | 1 | 0 | 0 | 0 |

```
BIT0         (.a(p0),.b(q1),.z(z[0]);
BIT1         (.a(p0),.b(q2),.z(z[1]);
BIT2         (.a(p0),.b(q4),.z(z[2]);
BIT3         (.a(p0),.b(q8),.z(z[3]);
   ·
   ·
   ·
BIT32        (.a(p10),.b(q9),.z(z[32]);
BIT33        (.a(p21),.b(q12),.z(z[33]);
BIT34        (.a(p11),.b(q5),.z(z[34]);
BIT35        (.a(p22),.b(q10),.z(z[35]);
BIT36        (.a(p21),.b(q0),.z(z[36]);
   ·
   ·
   ·
BIT318       (.a(p29),.b(q10),.z(z[318]);
BIT319       (.a(p26),.b(q5),.z(z[319]);
```

Fig. 15

| P \ Q | dp1 [8:0] | dp2 [8:0] | dp3 [8:0] | dp4 [8:0] | dp5 [8:0] | dp6 [8:0] | dp7 [8:0] | dp8 [8:0] | dp9 [8:0] | dp10 [8:0] | dp11 [8:0] | dp12 [8:0] | dp13 [8:0] | dp14 [8:0] | dp15 [8:0] | dp16 [8:0] | dp17 [8:0] | dp18 [8:0] | dp19 [8:0] | dp20 [8:0] | dp21 [8:0] | dp22 [8:0] | dp23 [8:0] | dp24 [8:0] | dp25 [8:0] | dp26 [8:0] | dp27 [8:0] | dp28 [8:0] | dp29 [8:0] | dp30 [8:0] | dp31 [8:0] |
|---|---|---|---|---|---|---|---|---|---|---|---|---|---|---|---|---|---|---|---|---|---|---|---|---|---|---|---|---|---|---|---|

```
BIT0      (.a(p0),.b(q1),..z(z[0]);
BIT1      (.a(p0),.b(q2),..z(z[1]);
BIT2      (.a(p0),.b(q4),..z(z[2]);
BIT3      (.a(p0),.b(q8),..z(z[3]);
   ⋮
BIT32     (.a(p10),.b(q9),..z(z[32]);
BIT33     (.a(p21),.b(q12),..z(z[33]);
BIT34     (.a(p11),.b(q5),..z(z[34]);
BIT35     (.a(p21),.b(q0),..z(z[35]);
BIT36     (.a(p22),.b(q10),..z(z[36]);
   ⋮
BIT318    (.a(p29),.b(q10),..z(z[318]);
BIT319    (.a(p26),.b(q5),..z(z[319]);
```

|  | x8 | x7 | x6 | x5 | x4 | x3 | x2 | x1 | x0 |
|---|---|---|---|---|---|---|---|---|---|
|  | y8 | y7 | y6 | y5 | y4 | y3 | y2 | y1 | y0 |
|  | x8y0 | x7y0 | x6y0 | x5y0 | x4y0 | x3y0 | x2y0 | x1y0 | x0y0 |
|  |  | x8y1 | x7y1 | x6y1 | x5y1 | x4y1 | x3y1 | x2y1 | x1y1 | x0y1 |
|  |  |  | x8y2 | x7y2 | x6y2 | x5y2 | x4y2 | x3y2 | x2y2 | x1y2 | x0y2 |
|  |  |  |  | x8y3 | x7y3 | x6y3 | x5y3 | x4y3 | x3y3 | x2y3 | x1y3 | x0y3 |
|  |  |  |  |  | x8y4 | x7y4 | x6y4 | x5y4 | x4y4 | x3y4 | x2y4 | x1y4 | x0y4 |
|  |  |  |  |  |  | x8y5 | x7y5 | x6y5 | x5y5 | x4y5 | x3y5 | x2y5 | x1y5 | x0y5 |
|  |  |  |  |  |  |  | x8y6 | x7y6 | x6y6 | x5y6 | x4y6 | x3y6 | x2y6 | x1y6 | x0y6 |
|  |  |  |  |  |  |  |  | x8y7 | x7y7 | x6y7 | x5y7 | x4y7 | x3y7 | x2y7 | x1y7 | x0y7 |
|  |  |  |  |  |  |  |  |  | x8y8 | x7y8 | x6y8 | x5y8 | x4y8 | x3y8 | x2y8 | x1y8 | x0y8 |
| a16 | a15 | a14 | a13 | a12 | a11 | a10 | a9 | a8 | a7 | a6 | a5 | a4 | a3 | a2 | a1 | a0 |

|  | x[8] | x[7] | x[6] | x[5] | x[4] | x[3] | x[2] | x[1] | x[0] |
|---|---|---|---|---|---|---|---|---|---|
| z[0] | y[1]^y[6] | y[2]^y[7] | y[3]^y[8] | y[4] | y[5] | y[6] | y[7] | y[8] | y[0] |
| z[1] | y[2]^y[7] | y[3]^y[8] | y[4] | y[5] | y[6] | y[7] | y[8] | y[0] | y[1] |
| z[2] | y[3]^y[8] | y[4] | y[5] | y[6] | y[7] | y[8] | y[0] | y[1] | y[2] |
| z[3] | y[4] | y[5] | y[6] | y[7] | y[8] | y[0] | y[1] | y[2] | y[3] |
| z[4] | y[1]^y[5]^y[6] | y[2]^y[6]^y[7] | y[3]^y[7]^y[8] | y[4]^y[8] | y[0]^y[5] | y[1]^y[6] | y[2]^y[7] | y[3]^y[8] | y[4] |
| z[5] | y[2]^y[6]^y[7] | y[3]^y[7]^y[8] | y[4]^y[8] | y[0]^y[5] | y[1]^y[6] | y[2]^y[7] | y[3]^y[8] | y[4] | y[5] |
| z[6] | y[3]^y[7]^y[8] | y[4]^y[8] | y[0]^y[5] | y[1]^y[6] | y[2]^y[7] | y[3]^y[8] | y[4] | y[5] | y[6] |
| z[7] | y[4]^y[8] | y[0]^y[5] | y[1]^y[6] | y[2]^y[7] | y[3]^y[8] | y[4] | y[5] | y[6] | y[7] |
| z[8] | y[0]^y[5] | y[1]^y[6] | y[2]^y[7] | y[3]^y[8] | y[4] | y[5] | y[6] | y[7] | y[8] |

|       | x[8]        |   | x[6]        |   | x[4] |   | x[2] |   | x[0] |
|-------|-------------|---|-------------|---|------|---|------|---|------|
| z[0]= | y[1]^y[6]   | ^ | y[3]^y[8]   | ^ | y[5] | ^ | y[7] | ^ | y[0] |
| z[1]= | y[2]^y[7]   | ^ | y[4]        | ^ | y[6] | ^ | y[8] | ^ | y[1] |
| ⋮     | ⋮           | ⋮ | ⋮           | ⋮ | ⋮    | ⋮ | ⋮    | ⋮ | ⋮    |
| z[8]= | y[0]^y[5]   | ^ | y[2]^y[7]   | ^ | y[4] | ^ | y[6] | ^ | y[8] |

Fig. 25
(1)
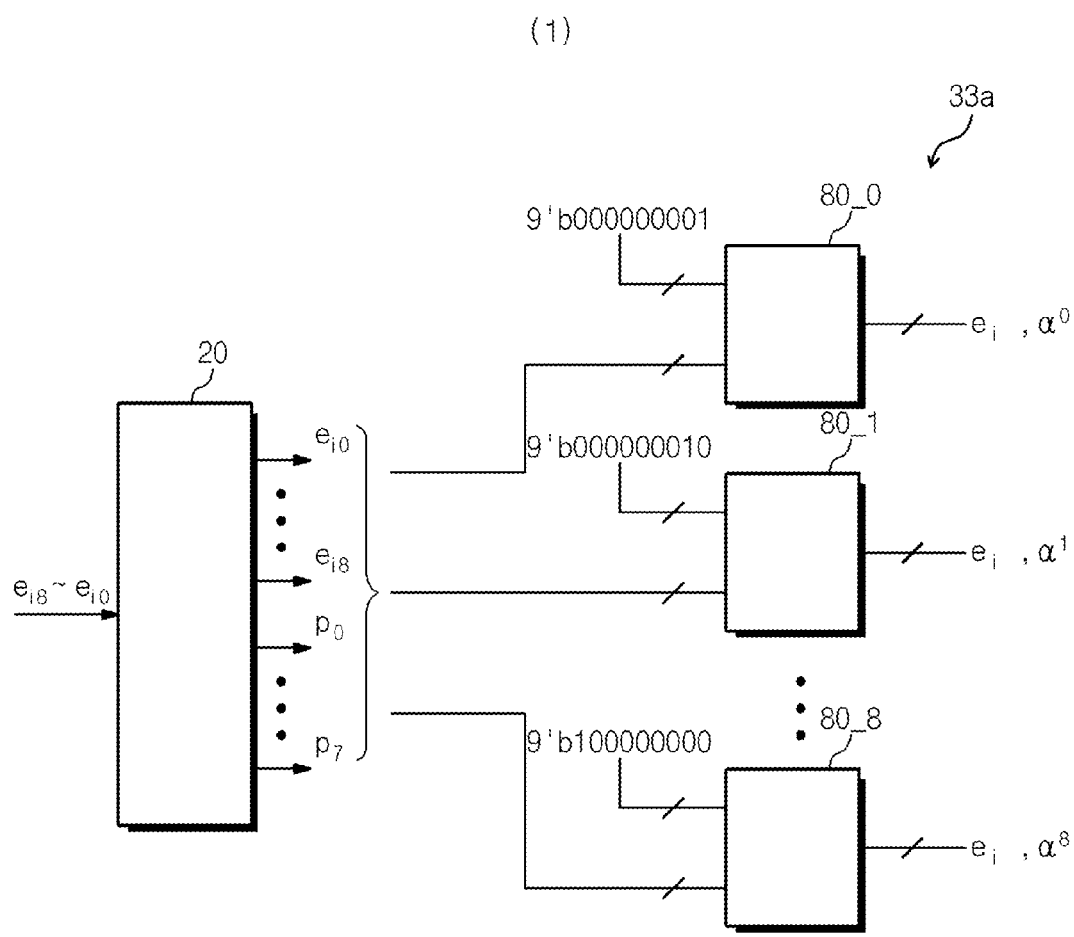
(2)
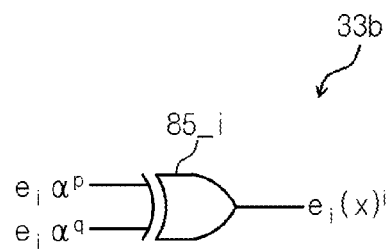

ERROR LOCATION SEARCH CIRCUIT, AND ERROR CHECK AND CORRECTION CIRCUIT AND MEMORY DEVICE INCLUDING THE SAME

CROSS-REFERENCE TO RELATED APPLICATIONS

This U.S. non-provisional patent application claims priority under 35 U.S.C. §119 of Japanese Patent Application No. 2012-209529, filed on Sep. 24, 2012, Japanese Patent Application No. 2012-209772, filed on Sep. 24, 2012, and Korean Patent Application 10-2013-0096080, filed on Aug. 13, 2013, the entire contents of each which are hereby incorporated by reference.

BACKGROUND

The present disclosure herein relates to a memory device, and more particularly, to an error location search circuit used in a memory device, and an error check and correction circuit and a memory device including the same.

NAND flash memory is one example of electrically erasable and programmable read only memory (EEPROM), there is a. A NAND flash memory may store large amounts of information in a small chip area by using NAND cell units where a plurality of memory cells are connected in series to each other.

In the case of a large capacity memory such as a NAND flash memory, a memory cell may lose its storage characteristics due to the deterioration of a tunnel oxide layer after several program operations. For example, while data is stored in a NAND flash memory, stored data may be damaged due to various causes. Therefore, an error rate may increase. Especially, as memory capacity is increased drastically and manufacturing processes become more complex, an error rate may increase. In order to solve the above issues and improve the performance of a flash memory, an error correction code (ECC) circuit is being used. If an ECC system is mounted in a chip, highly-reliable memory may be obtained. Furthermore, after redundant data of error correction code are added to data to be stored, the data are programmed as data strings. Additionally, when data is read, erroneous data is corrected with the redundant data of the error correction code.

Meanwhile, since data cannot be outputted to the outside of a memory until a correction operation of an ECC system is completed, it is necessary to reduce a time for completing the correction operation. For this, the use of the Hamming code which is capable of fast processing is studied. Also, a way for making the BCH (Bose-Chaudhuri-Hocquenghem) code which is capable of performing corrections of high orders be fast is being studied. The BCH code is one of block codes using a Galois Field operation. According to a block code such as the BCH code and the Reed-Solomon code, an error location may be calculated by using an error locator polynomial. For example, error location search is performed by calculating the roots of the polynomial after subsequently substituting each element, which is not 0, of the Galois Field into the error locator polynomial. This root search process is called Chien search. There are related art methods for increasing the speed of the Chien search, and related art methods for forming a NAND flash memory including an ECC circuit.

According to related art methods for increasing the speed of the Chien search, a configuration of a Chien search circuit indicating an error locator polynomial may use flip-flops, registers, and Galois field multiplication circuits. According to related art methods for increasing the speed of the Chien search, signals indicating bit positions are provided to the Chien search circuit and it is determined whether there is an error in a corresponding bit. In this case, a plurality of Chien search circuits may be equipped to determine whether there are errors in a plurality of bits in parallel.

According to related art methods for increasing the speed of the Chien search, as the number of bits processed in parallel is increased, the number of Chien search circuits is increased. Also, as the number of Chien search circuits is increased, the number of lines for providing signals that represents bit positions to the Chien search circuit is increased. Accordingly, as the number of bits processed in parallel is increased, scale of a Chien search unit including Chien search circuits and peripheral circuits is increased.

According to related art methods for forming a NAND flash memory including an ECC circuit, the ECC circuit substitutes bit positions of data strings into the error locator polynomial by a Chien Search unit and detects whether there is an error in a corresponding bit. When a data string is outputted, an address is substituted, from the lowest bit to the highest bit, into the Chien Search unit. Moreover, the ECC circuit corrects the data having error bits to output the corrected data, or outputs the data having no error bit as they are.

According to related art methods for forming a NAND flash memory including an ECC circuit, in order to read a bit of an arbitrary position in a data string, a bit outputted from the ECC circuit is stored in a buffer memory first, and then an address of a bit to be read is provided to the buffer memory. For example, until the ECC circuit corrects all data having error bits with respect to all bits of a data string including a bit to be read, it may be impossible to read the corrected data at high speed.

In order to output the corrected data to the outside of a memory at high speed, data having error bits in all bits of a data string including a bit to be read need to be corrected at high speed. In order to correct the data having an error bit at high speed, a method of simultaneously substituting address values from the lowest bit to the highest bit into the Chien search unit may be used. In order to use this method, the Chien search unit of the ECC circuit may need to include a position search circuit substituting bit positions into the error locator polynomial. In this case, the position search circuit may need to be equipped to correspond to each bit.

FIG. 26 is a block diagram illustrating a configuration of a Chien search unit 339 according to the related art. For example, it is assumed that the Chien search unit 339 uses a Galois Field $GF(2^9)$. Additionally, it is assumed that an ECC circuit using the BCH code to correct 4-bit errors is included. For example, on the basis of the Galois Field $GF(2^9)$, errors of 4-bit among 511-bit may be corrected. Although described later in detail, when 511-bit are simultaneously corrected through the Chien search unit 339 according to the related art under the above assumption, a total of 353612 logic circuits are required.

SUMMARY

Example embodiments of the inventive concepts may solve the issue of the increasing scale of the Chien search unit. Example embodiments of the inventive concepts provide an error correction code (ECC) circuit and a memory device detecting and correcting errors in a plurality of bits in parallel and having small scale.

Although described later in detail, when 511-bit are simultaneously corrected through the Chien search unit 339 of FIG. 26 according to the related art under the above assumption, a total of 353,612 logic circuits are required. However, according to example embodiments of the inventive concepts, the Chien search unit may be configured by a total of 36,824 logic circuits. The example embodiments of the inventive concepts may reduce scale of an error location search circuit and may provide an ECC circuit and a memory device including the error location search circuit having reduced scale.

Example embodiments of the inventive concepts may provide an error correction code (ECC) circuit comprising a Chien search unit that uses an arbitrary element of Galois Field $GF(2^n)$ as a substitution value of an error locator polynomial and determines whether there is an error in each bit of a data string. The Chien search unit may comprise a calculator circuit calculating a first bit string by multiplying a plurality of predetermined elements of the Galois Field $GF(2^n)$ and a predetermined value of (n-k)-bit, and calculating a second bit string by multiplying the plurality of predetermined elements of the Galois Field $GF(2^n)$ and a predetermined value of k-bit; and a plurality of Chien search circuits combining the first bit string and the second bit string to calculate the arbitrary element, and substituting the calculated arbitrary element into the error locator polynomial. The plurality of Chien search circuits may be arranged in a matrix along a row direction and a column direction. The first bit string may be provided in the row direction or the column direction, and the second bit string may be provided in a direction different from a direction in which the first bit string is provided among the row direction and the column direction. A used bit used as an element of the Galois Field $GF(2^n)$ and an unused bit not used as an element of the Galois Field $GF(2^n)$ may be rearranged in a bit space configured with the matrix of the first bit string and the second bit string.

Example embodiments of the inventive concepts may provide an error location search circuit substituting $(2^m-1)$ elements expressed as an m-bit vector on Galois Field $GF(2^m)$ into an error locator polynomial, and generating an error detection signal indicating whether there is an error in a bit in a position corresponding to each of the elements among data. The error location search circuit may comprise a plurality of position search circuits receiving each of the elements, substituting the received element into each term of the error locator polynomial, and multiplying a coefficient of the error locator polynomial and the received element to calculate an output value. An exclusive-or operation corresponding to each of the elements may be performed on a plurality of the output values calculated by the plurality of position search circuits. The error detection signal is generated based on a result of the exclusive-or operation.

Example embodiments of the inventive concepts may provide a memory device including a memory cell array, which may be, for example, a nonvolatile memory cell array; a page buffer including one or more page buffer circuits, the page buffer being configured to read data stored in the nonvolatile memory cell array during a read operation; and an error correction code (ECC) circuit, the ECC circuit being configured such that, during the data read operation, the ECC circuit receives the read data from the page buffer in the form of a first code data unit including a first information data string and first parity data, generates, by adding bits to the information data string, an extended data unit including a first extended data string and the first parity data, generates coefficients of an error locator polynomial based on the extended data unit, locates an error in the first information data string using a Galois Field operation based on the generated coefficients, corrects the located error in the first information data string, and outputs the corrected first information data string.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 2 is a conceptual diagram illustrating a configuration of code data according to example embodiments of the inventive concepts;

FIG. 7 is a table illustrating some elements of Galois Field GF(29) to describe the process of a Chien search unit according to example embodiments of the inventive concepts;

FIG. 8 is a view of expressions illustrating the contents of output signals from an S calculator, a P calculator, and a Q calculator of FIG. 4;

FIG. 9 is a table illustrating process of a Chien search unit of FIG. 4;

FIG. 13 is a table illustrating a calculation process of a syndrome calculator of FIG. 3 according to example embodiments of the inventive concepts;

FIGS. 14 and 15 are conceptual diagrams illustrating the arrangement of a Chien search circuit of FIG. 4;

FIG. 16 is other table illustrating a calculation process of a syndrome calculator of FIG. 3 according to example embodiments of the inventive concepts;

FIGS. 17 and 18 are other conceptual diagrams illustrating the arrangement of a Chien search circuit of FIG. 4;

FIG. 19 is a conceptual diagram illustrating components of a vector Z[8:0];

FIG. 20 is a table illustrating a process of calculating Z[8:0] obtained by multiplying X[8:0] and Y[8:0];

FIG. 22 is a table illustrating expressions for obtaining multiplication of X[8:0]=(1, 0, 1, 0, 1, 0, 1, 0, 1) and a coefficient vector e1 by using elements whose only one bit has a value of logic 1;

FIG. 25 is a block diagram illustrating a configuration of position search circuits of FIG. 24.

DETAILED DESCRIPTION OF THE EMBODIMENTS

Figure 1:
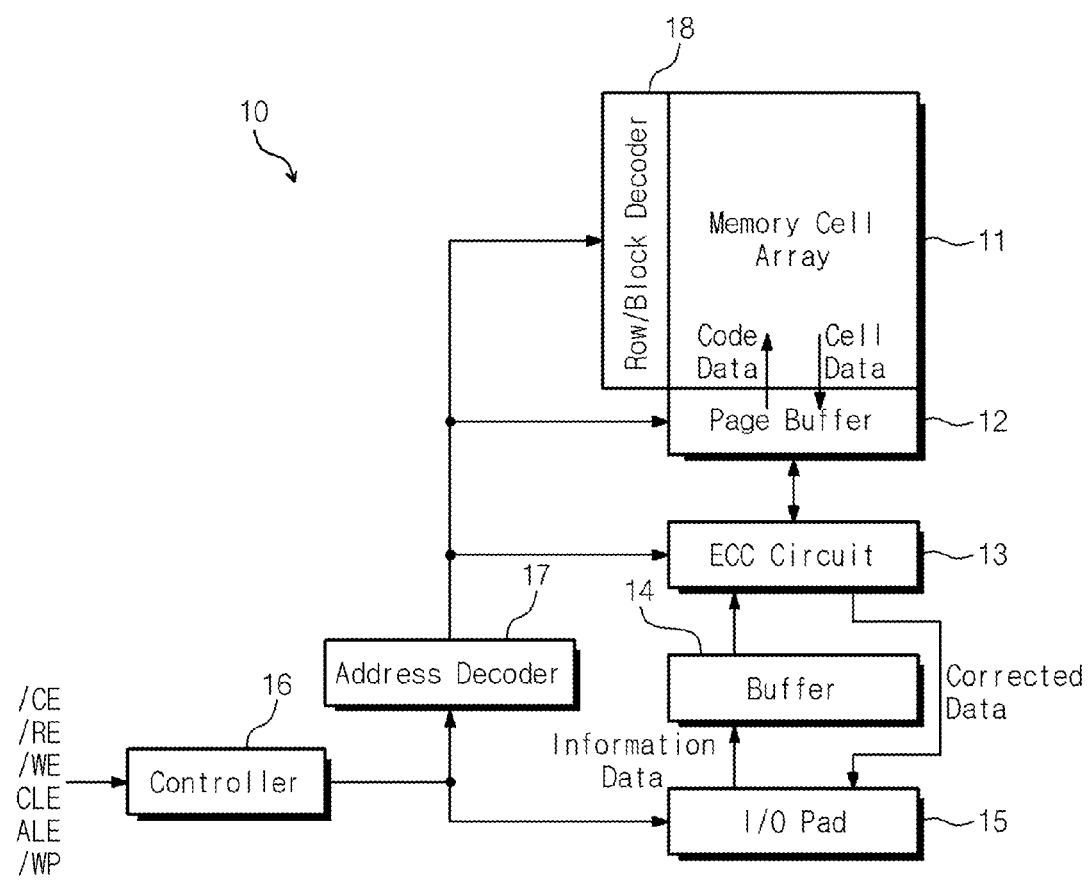
FIG. 1 is a block diagram illustrating a configuration of a nonvolatile memory device according to example embodiments of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.). The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a configuration of a nonvolatile semiconductor memory device according to example embodiments of the inventive concepts. The nonvolatile semiconductor memory device 10 may comprise a memory cell array 11, a page buffer 12, an error correction code (ECC) circuit 13, a buffer 14, an I/O pad 15, a controller 16, an address decoder 17, and a row/block decoder 18.

The memory cell array 11 may include a plurality of transistors of a stack gate structure. The memory cell array 11 may include a block where electrically rewritable nonvolatile memory cells are connected in series along a column direction so that NAND cell strings disposed at each bit line are arranged along a row direction. A plurality of the blocks may be disposed along a direction in which a bit line is extended. Additionally, the block may be configured as an erase unit of a memory cell. A word line lying at right angles to a bit line may be commonly connected to a gate of each nonvolatile memory cell disposed at the same row of each block. Nonvolatile memory cells selected by one word line may form a page which is a program/read unit.

The page buffer 12 may include one or more page buffer circuits. The one or more page buffer circuits may program or read data by a page unit. Each of the page buffer circuit may be connected to a bit line. The one or more page buffer circuits may each include a latch used as a sense amplifier that amplifies a voltage of a connected bit line and determine a logic value of the voltage. During a read operation of the nonvolatile semiconductor memory device 10, cell data including data stored in a memory cell of one page of the memory cell array 11 may be provided to the page buffer 12. The page buffer 12 may amplify the cell data and may provide the cell data to the ECC circuit 13.

Meanwhile, during a program operation of the nonvolatile semiconductor memory device 10, the page buffer 12 may store data provided from the ECC circuit 13 in the latch therein. The page buffer 12 may store all data as code data in a memory cell of one page while verifying the stored data. The code data may include parity data that the ECC circuit 13 generates.

The ECC circuit 13 may extend an information data string of 256-bit to an extended information data string of 448-bit by using Galois Field $GF(2^9)$. According to example embodiments of the inventive concepts, it is assumed that the extended information data string forms a correction unit. Additionally, it is assumed that one correction unit has the BCH code that is capable of correcting errors of 4-bit. It is assumed that the length of parity data in one correction unit is 36-bit. According to example embodiments of the inventive concepts, not only the BCH code, but also other block codes using the Galois Field operation can be used. According to example embodiments of the inventive concepts, a code data string of 320-bit including the information data of 256-bit and the parity data may be stored in the memory cell array 11 or may be read from the memory cell array 11.

Furthermore, according to example embodiments of the inventive concepts, during detecting and correcting errors in the code data of 320-bit, the correction unit is formed of the extended information data extended to 448-bit virtually, not being formed of the information data string of 256-bit included in the code data of 320-bit. For describing the data extension in more detail, FIG. 2 is described first.

FIG. 2 is a conceptual diagram illustrating a configuration of code data according to example embodiments of the inventive concepts. FIG. 2(1) illustrates a configuration of code data D1. The length of the code data D1 stored in the memory cell array 11 or read from the memory cell array 11 is 320-bit. The code data D1 may include information data D11 of 256-bit and added data D12 of 64-bit including parity data of 36-bit. The added data D12 may be placed at the front or, alternatively, the back of the information data D11.

Furthermore, FIG. 2(2) illustrates a configuration of extended code data D2. The length of the extended code data D2 processed when a syndrome is calculated by the ECC circuit 13 and a position of an error bit is searched is 512-bit. The extended code data D2 may include extended information data D21 of 448-bit and added data D 12 of 64-bit including parity data of 36-bit. The added data D12 in the code data D1 and the added data D12 in the extended code data D2 may have the same configuration. However, the contents of fixed data that are not the parity data in the added data D12 may vary. The added data D12 may be placed at the front or, alternatively, the back of the extended information data D21.

FIG. 2(3) illustrates a configuration of the extended information data D21. The extended information data D21 may include split information data D23a, D23b, . . . , in which the information data D11 is divided by a predetermined bit unit. Also, the extended information data D21 may include additional data D24a, D24b, . . . including at least one bit having logic 0 as a fixed value.

The split information data D23a, D23b, . . . may be obtained by splitting the information data D11 according to the bit order. Instead, the split information data D23a, D23b, . . . may be obtained by changing the bit order of the information data D11 (i.e., rearranging the bit order) and splitting the information data D11. The additional data D24a, D24b, . . . is a total of 192-bit. The position of each bit of the information data D11 is one of 0 to 255. Meanwhile, the position of each bit of the split information data D23a, D23b, . . . is one of 0 to 447. Moreover, the position of each bit of the additional data D24a, D24b, . . . is one of 0 to 447. However, the position of each bit of the split information data D23a, D23b, . . . is different from that of the additional data D24a, D24b, . . . .

The position of each bit of the extended information data D21 (or the position after the bit order is rearranged) may be preset in advance of an error correction operation. Furthermore, a configuration such as a logical structure and line connection of the ECC circuit 13 may be designed to fit the preset position of each bit. Moreover, parity data of 36-bit included in the added data D12 is generated based on the extended information data D21 of 448-bit. According to example embodiments of the inventive concepts, since the ECC circuit 13 uses the extended code data D2 that is virtually extended, the scale of a Chien search circuit may be reduced.

Here, the term "virtual" or "virtually" means that a circuit for processing a bit that is not included in the information data D11 and included only in the extended information data D21 is not actually added to a processing unit for the extended information data D21. For instance, addition of elements of the Galois Field may correspond to an exclusive-or operation, and combining an added bit with predetermined data may be omitted when the added bit is always logic 0. The reason is the reason why an additional configuration or an additional line may not be necessary even when a bit is added.

Again, the nonvolatile semiconductor memory device 10 of FIG. 1 is described. The ECC circuit 13 may process the extended code data D2 which the code data D1 read from the page buffer 12 is extended to during a read operation of the nonvolatile semiconductor memory device 10. The ECC circuit 13 may calculate coefficients of an error locator polynomial and store the calculated coefficients in a latch therein. Additionally, the ECC circuit 13 may correct an error of data of a bit whose position is indicated by a column address during a read operation. The ECC circuit 13 may output the corrected data to the outside of the device through the I/O pad 15. For instance, by disposing an I/O circuit between the I/O pad 15 and the ECC circuit 13, data may be outputted to the outside of the device.

Additionally, the ECC circuit 13 may receive information data provided from the I/O pad 15 through the buffer 14 during a program operation of the nonvolatile semiconductor memory device 10. The ECC circuit 13 may generate the extended information data D21 that is virtually extended on the basis of the received information data D11 and generate parity data on the basis of the extended information data D21. The ECC circuit 13 may provide the information data 11 and the parity data to the page buffer 12. The page buffer 12 may store the received data as the code data D1 in a memory cell of a selected page.

The controller 16 may receive various control signals and control program, read, and erase operations and validation on a nonvolatile memory cell. For example, the control signals may include an external clock signal, a chip enable signal /CE, a read enable signal /RE, a program enable signal /WE, a command latch enable signal CLE, an address latch enable signal ALE, and a program prohibit signal /WP. The controller 16 may generate internal control signals according to an operation mode that the control signals and command data inputted to the I/O pad 15 indicate. For example, at the rising edge of the program enable signal /WE, since the voltage of the command latch enable signal CLE changes from a low level into a high level, the controller 16 receives command data from the I/O pad 15 and then stores the received data in a register therein.

The address decoder 17 may store an address (e.g., a row address or a block address) inputted from the I/O pad 15 in response to the internal control signals provided from the controller 16. Moreover, the address decoder 17 may provide the stored address to the row/block decoder 18, the page buffer 12, and the ECC circuit 13 in response to the internal control signals provided from the controller 16. For example, at the rising edge of the program enable signal /WE, since the voltage of the address latch enable signal ALE changes from a low level into a high level, the controller 16 receives the address from the I/O pad 15 and then stores the received address in an internal register of the address decoder 17.

The row/block decoder 18 may select a memory cell in a page by selecting a block and a word line of the memory cell array 11 according to a row address and a block address stored in the address decoder 17. Furthermore, the address decoder 17 may select a bit line of the memory cell array 11 and the page buffer 12 according to a column address.

During a read operation according to example embodiments of the inventive concepts, the cell data (e.g., the code data D1) of the page buffer 12 are read by the ECC circuit 13, and the extended information data D21 virtually extended are generated, and the coefficients of the error locator polynomial are calculated by each correction unit. Also, according to the coefficients calculated by each correction unit and a signal indicating the position of an error bit (i.e., a data signal corresponding to each element of the Galois Field GF($2^9$)), it is detected whether there is an error in the data of a bit that is indicated to have an error. If there is an error, the error may be corrected and the corrected data may be provided to the I/O pad 15.

During a program operation, the cell data of the page buffer 12 may be read by the buffer 14. For example, the buffer 14 may configured with Static Random Access Memory (SRAM). The data of a bit whose position is marked by a column address among the cell data read by the buffer 14 may be replaced with information data of the I/O pad 15. Additionally, the ECC circuit 13 may calculate parity data corresponding to the data of the correction unit including the corrected data. Then, the data including the calculated parity data may be stored as code data in a page selected by the page buffer 12.

Figure 3:
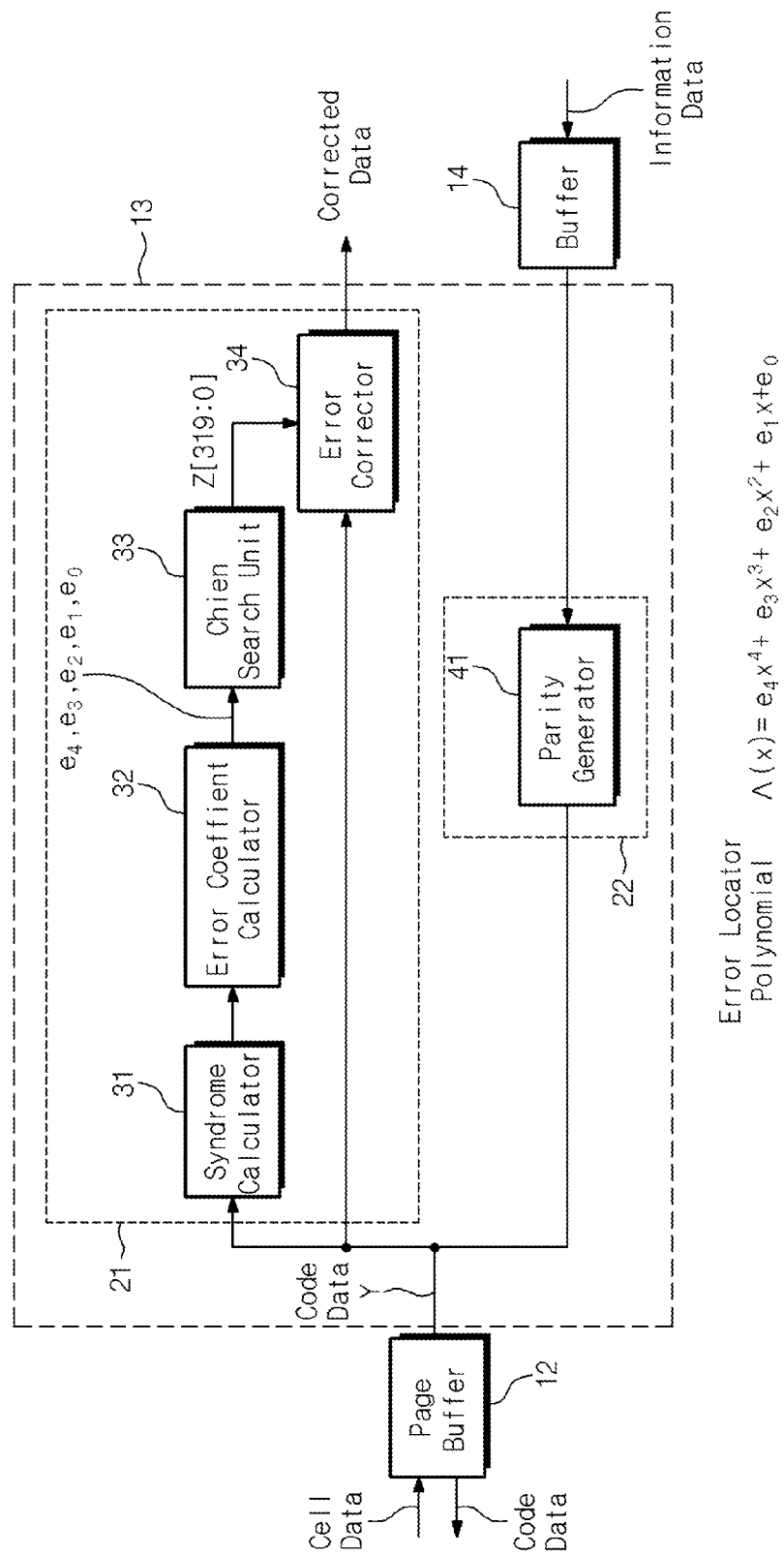
FIG. 3 is a block diagram illustrating a configuration of an ECC circuit of FIG. 1.

FIG. 3 is a block diagram illustrating a configuration of an ECC circuit 13 of FIG. 1. The ECC circuit 13 may include a decoder 21 and an encoder 22. The decoder 21 decodes data. The encoder 22 generates parity data for correction and adds the parity data for correction to data stored in a memory cell.

The encoder 22 may include a parity generator 41. The parity generator 41 may extend the information data stored in the buffer 14 to the extended information data D21. The parity generator 41 may divide the extended information data D21 by a generation or, alternatively, generator polynomial to generate parity data. Additionally, the parity generator 41 may add the generated parity data to the information data and provide the information data including the parity data to the page buffer 12. Data provided to the page buffer 12 become the code data that are stored in a selected page during a program operation of the nonvolatile semiconductor memory device 10. According to example embodiments of the inventive concepts, the layout scale of the ECC circuit 13 may be reduced, and data may be corrected by the efficiently configured ECC circuit 13.

The decoder 21 may include a syndrome calculator 31, an error coefficient calculator 32, a Chien search unit 33, and an error corrector 34. The syndrome calculator 31 may receive a code data string Code Data Y by each correction unit. The syndrome calculator 31 may extend the code data string Code Data Y to generate the extended code data D2 virtually. Additionally, the syndrome calculator 31 may divide the extended code data D2 by independent minimal polynomials to calculate a plurality of syndromes. According to example embodiments of the inventive concepts, it is assumed that the BCH which is capable of correcting an error of 4-bit data is used. Accordingly, the independent minimal polynomial is four, and the syndrome calculator 31 calculates four syndromes S1, S3, S5, and S7.

The error coefficient calculator 32 may calculate coefficients $e_4$, $e_3$, $e_2$, $e_1$, and $e_0$ of an error locator polynomial $\Lambda(x)$ by each correction unit (i.e., a unit of the extended code data D2) by using the calculated syndromes. The coefficients $e_4$, $e_3$, $e_2$, $e_1$, and $e_0$ are coefficients of the error locator polynomial $\Lambda(x)=e_4x^4+e_3x^3+e_2x^2+e_1x^1+e_0$ shown in FIG. 3. The Chien search unit 33 may use the error locator polynomial $\Lambda(x)$ when determining whether there is an error in the data read by each correction unit from the page buffer 12.

The Chien search unit 33 may detect an error of each correction unit by using the coefficients $e_4$, $e_3$, $e_2$, $e_1$, and $e_0$ provided from the error coefficient calculator 32. Once the error is detected, the Chien search unit 33 may output a signal Z[319:0] indicating a bit position of data having the error. The outputted signal Z[319:0] may include data of 320-bit indicating values of the error locator polynomial corresponding to a position of each bit of the code data D1. Each of bits z[0], z[1], ..., z[319] of the outputted signal Z[319:0]) may indicate whether there is an error in the 0th, 1st, ..., 319th bits (it is assumed that the 0th bit is the least significant bit) of the data, respectively. According to example embodiments of the inventive concepts, it is assumed that there is an error in the $i^{th}$ bit of the data where a value of z[i] is logic 1 and there is not an error in the $i^{th}$ bit of the data where a value of z[i] is logic 0.

The error corrector 34 may invert a value of a bit in the position where an error is detected among the code data string Code Data Y when bits having an error are less than 4 bits (i.e., i where z[i]=1 is an integer less than 4).

Figure 4:
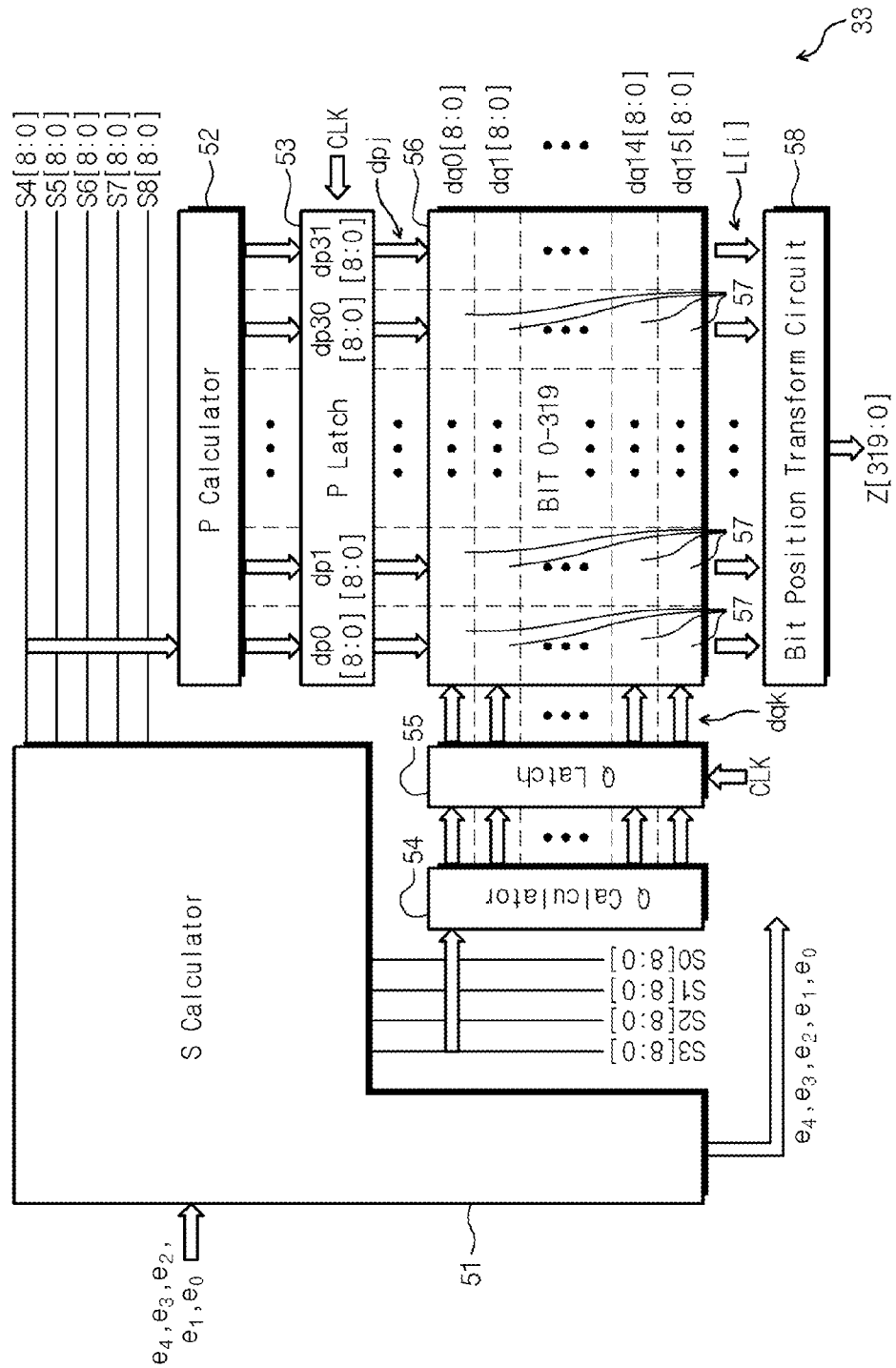
FIG. 4 is a block diagram illustrating a configuration of a Chien search unit of FIG. 3.

FIG. 4 is a block diagram illustrating a configuration of the Chien search unit 33 of FIG. 3. The Chien search unit 33 may include an S calculator 51, a P calculator 52, a P latch 53, a Q calculator 54, a Q latch 55, a Chien search circuit group 56, and a bit position transform circuit 58. The Chien search circuit group 56 may include a plurality of Chien search circuits 57. The plurality of Chien search circuits 57 may be arranged in a matrix along a row direction and a column direction in the Chien search circuit group 56. Referring to FIG. 4, the plurality of Chien search circuits 57 are arranged in a lattice form of 16 rows and 32 columns (i.e., 16 along a vertical direction and 32 along a horizontal direction). However, each of the plurality of Chien search circuits 57 does not need to be arranged at all intersection points of the rows and the columns (512 points (=16×32) in FIG. 4). The Chien search circuit 57 may be appropriately omitted depending on the position of a bit (i.e., an error detection target) or the length of code data (i.e., the number of used bits).

Figure 5:
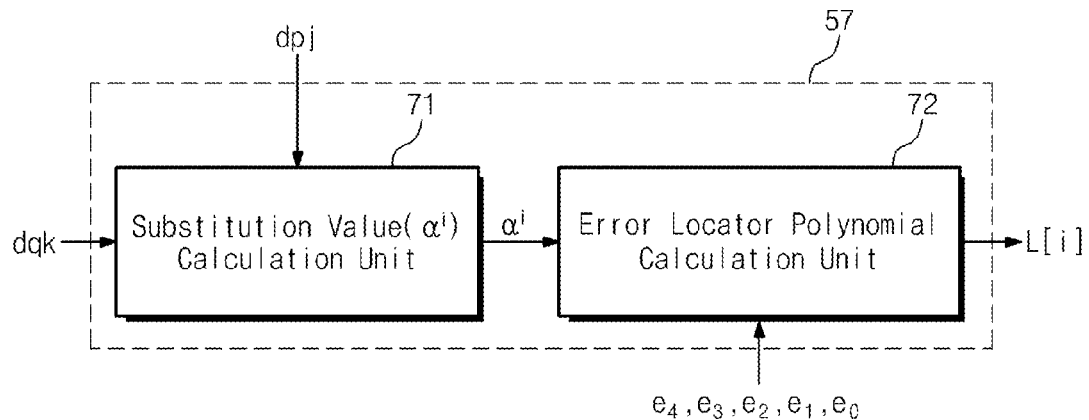
FIG. 5 is a block diagram illustrating a configuration of a Chien search circuit of FIG. 4.

First, referring to FIG. 5, a configuration of each Chien search circuit 57 is described. FIG. 5 is a block diagram illustrating a configuration of the Chien search circuit 57 of FIG. 4. The Chien search circuit 57 may include a substitution value calculation unit 71 and an error locator polynomial calculation unit 72. The substitution value calculation unit 71 may calculate an element $\alpha^i$ (i is one of 0 to 510) of the Galois Field $GF(2^9)$ substituted into x of the error locator polynomial $\Lambda(x)$. $\alpha^i$ is obtained by combining a bit string signal dpj (j is one of 0 to 31) provided from the P latch 53 of FIG. 4 and a bit string signal dqk (k is one of 0 to 15) provided from the Q latch 55 of FIG. 4.

The error locator polynomial calculation unit 72 may calculate a value of the error locator polynomial $\Lambda(x)$ by substituting the element $\alpha^i$ into x of the error locator polynomial $\Lambda(x)$. The value of the error locator polynomial $\Lambda(x)$ is calculated based on the element $\alpha^i$ provided from the substitution value calculation unit 71 and the coefficients $e_4$, $e_3$, $e_2$, $e_1$, and $e_0$ of the error locator polynomial provided from the S calculator 51. For example, an output L[i] of the error locator polynomial calculation unit 72 may be set to have a value of logic 1 when $\Lambda(\alpha^i)=0$, and set to have a value of logic 0 when $\Lambda(\alpha^i)\neq 0$.

Figure 6:
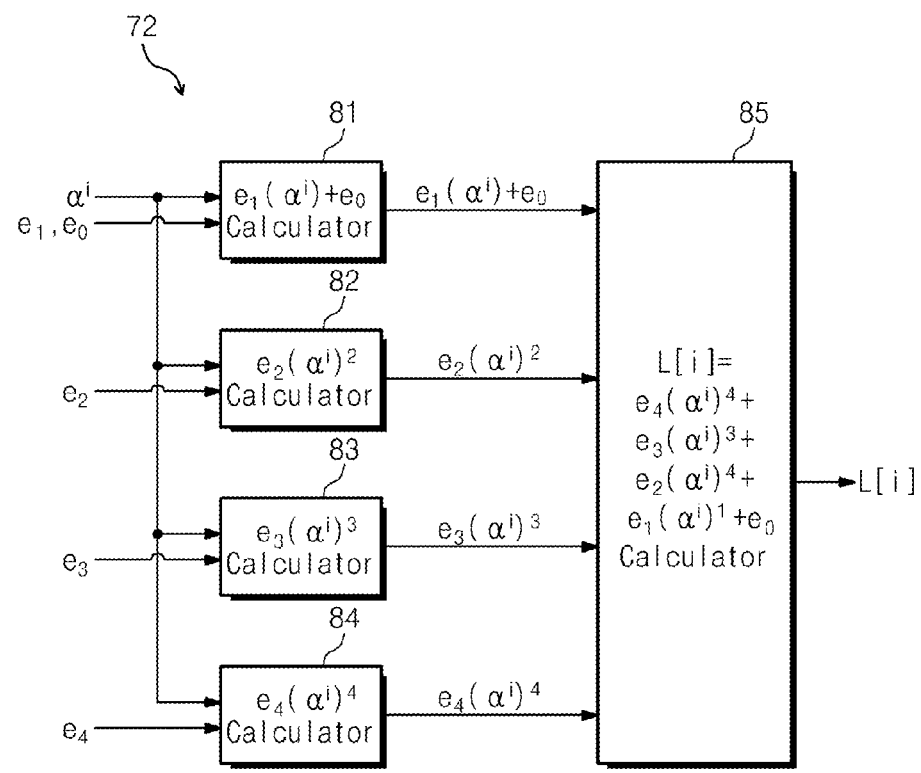
FIG. 6 is a block diagram illustrating a configuration of an error locator polynomial calculation unit of FIG. 5.

Then, referring to FIG. 6, a configuration of the error locator polynomial calculation unit 72 is described. FIG. 6 is a block diagram illustrating a configuration of the error locator polynomial calculation unit 72 of FIG. 5. The error locator polynomial calculation unit 72 may include an $e_1(\alpha^i)+e_0$ calculator 81, an $e_2(\alpha^i)^2$ calculator 82, an $e_3(\alpha^i)^3$ calculator 83, an $e_4(\alpha^i)^4$ calculator 84, and an L[i] calculator 85. The an $e_1(\alpha^i)+e_0$ calculator 81 may receive the element $\alpha^i$ and the coefficients $e_1$ and $e_0$ to calculate $e_1(\alpha^i)+e_0$. The $e_2(\alpha^i)^2$ calculator 82 may receive the element $\alpha^i$ and the coefficient $e^2$ to calculate $e_2(\alpha^i)^2$. The $e_3(\alpha^i)^3$ calculator 83 may receive the element $\alpha^i$ and the coefficient $e^3$ to calculate $e_3(\alpha^i)^3$. The $e_4(\alpha^i)^4$ calculator 84 may receive the element $\alpha^i$ and the coefficient $e^4$ to calculate $e_4(\alpha^i)^4$. Also, the L[i] calculator 85 may receive the outputs of the $e_1(\alpha^i)+e_0$ calculator 81, the $e_2(\alpha^i)^2$ calculator 82, the $e_3(\alpha^i)^3$ calculator 83, and the $e_4(\alpha^i)^4$ calculator 84, to calculate $e_4(\alpha^i)^4+e_3(\alpha^i)^3+e_2(\alpha^i)^2+e_1(\alpha^i)+e_0$. Additionally, the L[i] calculator 85 may determine whether the calculated value is 0. The L[i] calculator 85 may set L[i]=1 when the determination result is $\Lambda(0=0$, and set L[i]=0 when $\Lambda(\alpha^i)\neq 0$ to output L[i]. For example, the $e_2(\alpha^i)^2$ calculator 82, the $e_3(\alpha^i)^3$ calculator 83, and the $e_4(\alpha^i)^4$ calculator 84 may be configured with a plurality of multipliers. In this case, each calculation value may be simultaneously obtained during one clock period.

Referring to FIG. 4, the S calculator 51 may receive the coefficients $e_4$, $e_3$, $e_2$, $e_1$, and $e_0$ from the error coefficient calculator 32. The S calculator 51 may provide the received coefficients $e_4$, $e_3$, $e_2$, $e_1$, and $e_0$ to each of the plurality of Chien search circuits 57 as they are. Additionally, the S calculator 51 may generate parts of the elements of the Galois Field $GF(2^9)$ substituted into the error locator polynomial $\Lambda(x)$ when each Chien search circuit 57 performs Chien search. Then, the S calculator 51 may output signals S0, S1, S2, S3, S4, S5, S6, S7, and S8 corresponding to each generated element.

Now, the signals S0, S1, S2, S3, S4, S5, S6, S7, and S8 that the S calculator 51 outputs are described with reference to FIG. 7. FIG. 7 is a table illustrating some elements of the Galois Field $GF(2^9)$ to describe the process of the Chien search unit 33 according to example embodiments of the inventive concepts. Each element may be expressed according to power expression, polynomial expression, and vector expression. In the Galois Field $GF(2^9)$(m=9), with respect to each of the 9 elements of $1(=\alpha^0), \alpha^1, \alpha^2, \ldots \alpha^8, (=\alpha^{m-1})$ of the power expression, only one bit among 9 bits has a value of logic 1 according to the vector expression. Referring to FIG. 7, vectors corresponding to each of the 9 elements $\alpha^0, \alpha^1, \alpha^2, \ldots, \alpha^8$ of the power expression are expressed as 9'b000000001, 9'b000000010, 9'b000000100, 9'b000001000, 9'b000010000, 9'b000100000, 9'b001000000, 9'b010000000, and 9'b100000000. Elements $\alpha^i$ (i=9, 10, ..., 510) except for $\alpha^0, \alpha^1, \alpha^2, \ldots, \alpha^8$ among the elements of the Galois Field $GF(2^9)$ may be obtained by adding at least two of the 9 elements $\alpha^0, \alpha^1, \alpha^2, \ldots, \alpha^8$.

For example, the element $\alpha^9$ corresponding to the 9th bit that is to be substituted into the error locator polynomial $\Lambda(x)$ may be generated by an equation $\alpha^9=1+\alpha^4$. $\alpha^{10}, \ldots, \alpha^{510}$ may be also obtained by combining the 9 elements of $\alpha^0, \alpha^1, \alpha^2, \ldots, \alpha^8$.

FIG. 8 is a view of expressions illustrating the contents of output signals from the S calculator 51, the P calculator 52, and the Q calculator 54 of FIG. 4. As shown in FIG. 8(1), the S calculator 51 may generate the 9 elements of $\alpha^0, \alpha^1, \alpha^2, \alpha^8$ and output signals S0, S1, S2, S3, S4, S5, S6, S7, and S8 corresponding to the generated elements. Each of the output signals S0, S1, S2, S3, S4, S5, S6, S7, and S8 is a 9-bit signal.

The Chien search circuit 57 according to example embodiments of the inventive concepts may calculate a value of the error locator polynomial $\Lambda(x)$. The value of the error locator polynomial $\Lambda(x)$ may be calculated when error locator polynomial calculation unit 72 uses $\alpha^i$ calculated by the substitution value calculation unit 71 as a substitution value. Each Chien search circuit 57 may receive the signals indicating the 9 elements of $\alpha^0, \alpha^1, \alpha^2, \ldots, \alpha^8$ and obtain an arbitrary element $\alpha^i$ among the all elements $\alpha^0, \alpha^1, \ldots, \alpha^{510}$. Then, each Chien search circuit 57 may calculate the value of the error locator polynomial $\Lambda(x)$ with respect to the arbitrary element $\alpha^i$. For this, the signals indicating the 9 elements of $\alpha^0, \alpha^1, \alpha^2, \ldots, \alpha^8$ need to be provided to the Chien search circuit 57. However, not all the Chien search circuits 57 use all the signals indicating the 9 elements of $\alpha^0, \alpha^1, \alpha^2, \ldots, \alpha^8$. Providing unnecessary signals may cause increase the number of unnecessary lines.

The 9 elements of $\alpha^0, \alpha^1, \alpha^2, \ldots, \alpha^8$ may be called the basis. In order to reduce the number of unnecessary lines, the bases are divided into two signal groups (i.e., a P group and a Q group) according to the embodiment of FIG. 4. Moreover, the P group is divided into 32 divisions and the Q group is divided into 16 divisions according to the semi-basis (For example, the signal groups are divided into a total of 512). Also, a signal corresponding to one division of one signal group is provided to one Chien search circuit 57. Therefore, each Chien search circuit 57 may calculate only one predetermined element $\alpha^i$. If all signals indicating the 9 elements of $\alpha^0, \alpha^1, \alpha^2, \ldots, \alpha^8$ are provided, signal lines for 81 bits (=9 bits×9) may be required. However, according to example embodiments of the inventive concepts, an arbitrary element $\alpha^i$ may be calculated by using only two signal lines for 9 bits (i.e., 18 bits) lying at right angles to each other on one Chien search circuit 57.

FIG. 9 is a table illustrating process of the Chien search unit 33 of FIG. 4. Referring to FIGS. 9(1) and 9(2), the semi-bases may include 5-bit values p0 to p31 of the P group and 4-bit values q0 to q15 of the Q group. p0 to p31 may have values obtained by using the bases $\alpha^4, \alpha^5, \alpha^6, \alpha^7$, and $\alpha^8$ which are related with the 5 most significant bits of x. In more detail, p0 to p31 may have values of x=9'b00000_0000, 9'b00001_0000, 9'b00010_0000, . . . , 9b11111_0000, respectively. Meanwhile, q0 to q15 may have values obtained by using the bases $\alpha^0, \alpha^1, \alpha^2$, and $\alpha^3$ which are related with the 4 least significant bits of x. According to example embodiments of the inventive concepts, the 9 elements of $\alpha^0, \alpha^1, \alpha^2, \ldots, \alpha^8$ and the remaining elements $\alpha^9, \ldots, \alpha^{510}$ may be generated on the basis of a combination of the bit string signals dpj and dqk generated according to the semi-bases of the P group and the Q group. The bit string signals dpj and dqk of the P group and the Q group may be calculated by the P calculator 52 and the Q calculator 54.

The Chien search unit 33 of FIG. 4 is described again. The P calculator 52 may generate bit string signals dp0, dp1, dp2, . . . , dp31 of 9-bit on the basis of the 9-bit signals S4, S5, S6, S7, and S8 by using the expressions of FIG. 8(2). For example, the signal dp1 may be obtained by addition of a result of multiplication of the 4th bit of the semi-basis p1 and each bit of the signal S4, a result of multiplication of the 5th bit of the semi-basis p1 and each bit of the signal S5, a result of multiplication of the 6th bit of the semi-basis p1 and each bit of the signal S6, a result of multiplication of the 7th bit of the semi-basis p1 and each bit of the signal S7, and a result of multiplication of the 8th bit of the semi-basis p1 and each bit of the signal S8. Furthermore, the signal dp2 may be obtained by addition of a result of multiplication of the 4th bit of the semi-basis p2 and each bit of the signal S4, a result of multiplication of the 5th bit of the semi-basis p2 and each bit of the signal S5, a result of multiplication of the 6th bit of the semi-basis p2 and each bit of the signal S6, a result of multiplication of the 7th bit of the semi-basis p2 and each bit of the signal S7, and a result of multiplication of the 8th bit of the semi-basis p2 and each bit of the signal S8.

The signals dp0, dp1, dp2, . . . , dp31 calculated by the P calculator 52 may be provided to the P latch 53. In order to adjust clock skew, the P latch 53 may output latched signals dp0, dp1, dp2, . . . , dp31 in synchronization with a predetermined clock signal. The signals dp0, dp1, dp2, . . . , dp31 outputted from the P latch 53 may be provided to the plurality of Chien search circuits 57 through signal lines arranged along a column direction. The signal lines arranged along the column direction may include signal lines for 9 bits of each of 32 divisions.

The Q calculator 54 may generate bit string signals dq0, dq1, dq2, . . . , dq15 of 9-bit on the basis of the 9-bit signals S0, S1, S2, and S3 by using the expressions of FIG. 8(3). For example, the signal dq1 may be obtained by addition of a result of multiplication of the 3rd bit of the semi-basis q1 and each bit of the signal S3, a result of multiplication of the 2nd bit of the semi-basis q1 and each bit of the signal S2, a result of multiplication of the 1st bit of the semi-basis q1 and each bit of the signal S1, and a result of multiplication of the 0th bit of the semi-basis q1 and each bit of the signal S0. Furthermore, the signal dq2 may be obtained by addition of a result of multiplication of the 3rd bit of the semi-basis q2 and each bit of the signal S3, a result of multiplication of the 2nd bit of the semi-basis q2 and each bit of the signal S2, a result of multiplication of the 1st bit of the semi-basis q2 and each bit of the signal S1, and a result of multiplication of the 0th bit of the semi-basis q2 and each bit of the signal S0.

The signals dq0, dq1, dq2, . . . , dq15 calculated by the Q calculator 54 may be provided to the Q latch 55. In order to adjust clock skew, the Q latch 55 may output latched signals dq0, dq1, dq2, . . . , dq15 in synchronization with a predetermined clock signal. The signals dq0, dq1, dq2, . . . , dq15 outputted from the Q latch 55 may be provided to the plurality of Chien search circuits 57 through signal lines arranged along a row direction. The signal lines arranged along the row direction may include signal lines for 9 bits of each of 16 divisions.

However, the configurations of the bit string signals dpj and dqk are not limited to the above embodiments. For example, directions that the bit string signals dpj are provided along and directions that the bit string signals dqk are provided along may be interchangeable with respect to the rows and the columns. Moreover, the number of lines for providing the bit string signals dpj or the bit string signals dqk may vary. According to an embodiment of inventive concepts, the plurality of Chien search circuits 57 may be arranged in a matrix along a row direction and a column direction. Additionally, the bit string signal dpj may be provided in a row direction or a column direction, and the bit string signal dqk may be provided in a direction different from the direction in which the bit string signal dpj is provided among the row direction and the column direction.

The bit position transform circuit 58 may receive a signal L[i] outputted from each of the plurality of Chien search circuits 57. The bit position transform circuit 58 may transform a value of i indicating a bit position to generate an output signal Z[319:0]. As mentioned above, the signal L[i] indicates whether there is an error in the $i^{th}$ bit of the extended code data D2 of 512-bit. Moreover, each bit of the signal Z[319:0] indicates whether there is an error in each bit position of the code data D1 of 320-bit. The bit position transform circuit 58 may transform each signal L[i] to the signal Z[319:0] on the basis of a correspondence relationship between each bit of the split information data D23a, D23b, . . . in the extended code data D2 and each bit of the information data D11 in the code data D1.

A circuit for correcting n errors by using Galois Field $GF(2^m)$ substitutes each element $\alpha^i$ (i=0, 1, 2, . . . , $2^m-2$) of the Galois Field $GF(2^m)$ for a variable x of an error locator polynomial $\Lambda(x)=e_n x^n+ \ldots +e_2 x^2+e_1 x+e_0$ during a Chien search process, and determines whether $\Lambda(x)=0$. A value of the error locator polynomial $\Lambda(x)$ may be calculated by substituting each of the elements $\alpha^0, \alpha^1, \alpha^2, \ldots, \alpha^{t-2}$ ($t=2^m$)) of the Galois Field $GF(2^m)$ into the error locator polynomial $\Lambda(x)$.

According to the related art, each element $\alpha^i$ (i=0, 1, 2, . . . , $2^m-2$) of the Galois Field $GF(2^m)$ is sequentially substituted into one circuit for calculating the value of the error locator polynomial $\Lambda(x)$. Accordingly, during one period of a clock signal, one value of the error locator polynomial $\Lambda(x)$ with respect to one element is calculated. However, according to related art methods for increasing the speed of the Chien search, the values of the error locator polynomial $\Lambda(x)$ with respect to a plurality of elements are simultaneously calculated in parallel since Chien search is performed in parallel.

Furthermore, according to example embodiments of the inventive concepts, each element $\alpha^i$ (i=0, 1, 2, . . . , $2^m-2$) of the Galois Field $GF(2^m)$ is provided to one of the plurality of Chien search circuits 57. For example, according to example embodiments of the inventive concepts, the plurality of Chien search circuits 57 may calculate the values of the error locator polynomial $\Lambda(x)$ with respect to all elements of the Galois Field $GF(2^m)$ simultaneously.

According to an embodiment of inventive concepts, the plurality of Chien search circuits 57 may be arranged in a matrix. Also, according to example embodiments of the inventive concepts, bases are divided into two groups, and values included in each group may be provided in two intersecting directions of a row direction and a column direction. Therefore, according to example embodiments of the inventive concepts, lines for providing values substituted to the error locator polynomial $\Lambda(x)$ may be connected along the shortest path by appropriately arranging the plurality of Chien search circuits 57 and dividing groups.

Figure 10:
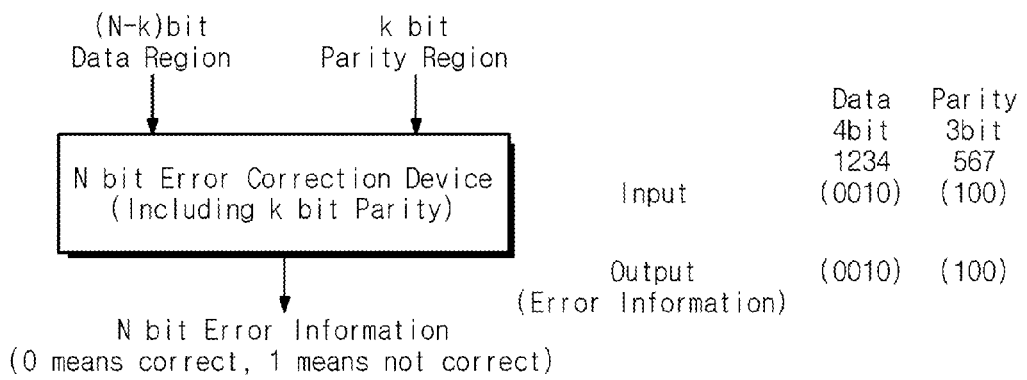
FIGS. 10 to 12 are conceptual diagrams illustrating the concept of an error search bit rearrangement according to example embodiments of the inventive concepts.
Figure 11:
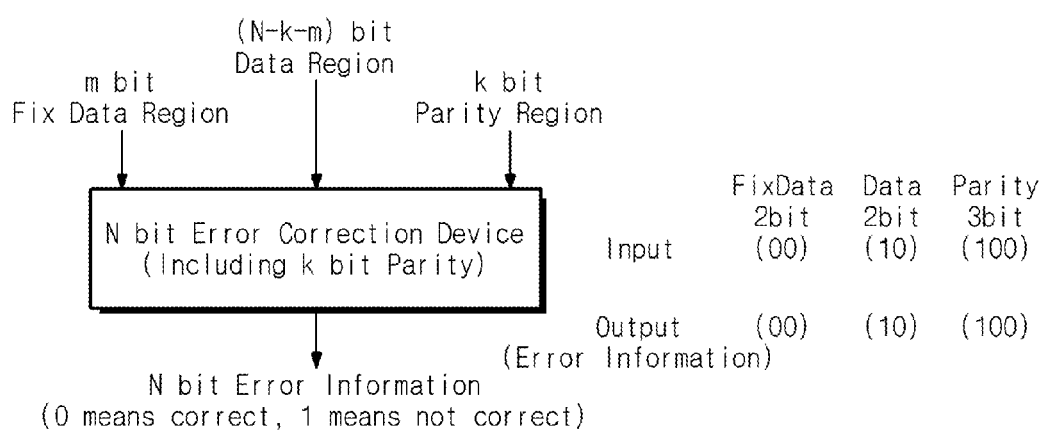
Figure 12:
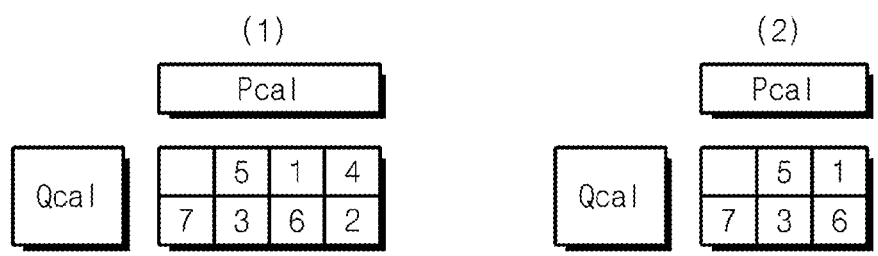

FIGS. 10 to 12 are conceptual diagrams illustrating the concept of an error search bit rearrangement according to example embodiments of the inventive concepts. FIG. 10 illustrates an input/output during a decoding process of a parallel Chien search. For example, FIG. 10 illustrates input/output data of an error correction system using a parallel Chien search according to example embodiments of the inventive concepts. Simple 4-3 code is shown at the right side of FIG. 10, and the final error information Output is outputted as a bit string of 7-bit. FIG. 11 illustrates a system not using some of 4-bit data and setting not used bits as fixed bits.

Referring to FIG. 11, the first and second bits of the 4-bit data are set as fixed bits (the first two bits are fixed to 00). During an encoding process, parity data for 4-bit data 0010 including the fixed bits are generated. Like FIG. 9, parity data 100 are generated in FIG. 11. An error correction device operates during a decoding process in the same manner and may also operate without any problem when fixed bits are included. Although the first and second bits are set as fixed bits as shown in FIG. 11, the error correction device operates without any problem even when other bits are set as fixed bits.

When fixed bits are included, it is important that there is no error in the fixed bits. Referring to FIG. 12, a block surrounding a number represents a Chien search circuit. In the case that a Chien search circuit is disposed as shown in FIG. 12(1), if the fixed bits are set in the positions of the number 4 and the number 2, the number of P groups is reduced as shown in FIG. 12(2). Since there is no need to perform error detection on the fixed bits, a corresponding Chien search circuit may be omitted.

For example, it is known that syndromes for input X1 to input X7 of the encoder may be calculated by exclusive-or (XOR, symbol A) operation, for example, S1=X1^X3^X4^X7. However, when the term X4 is the fixed bit set to logic 0, the term X4 can be deleted from the expression and the syndrome is expressed as S1=X1^X3^X7. Accordingly, if there is a fixed bit, some logical circuits in the syndrome calculator may be omitted. However, parity data are generated based on the information data and bits included in the parity data cannot be set to the fixed bits. Accordingly, the parity data are excluded from the discussion.

As mentioned above, when unused bits are appropriately selected from a matrix of $2^n$ and the selected bits are set as the fixed bits, the scale of the Chien search circuit may be minimized.

Figure 13:
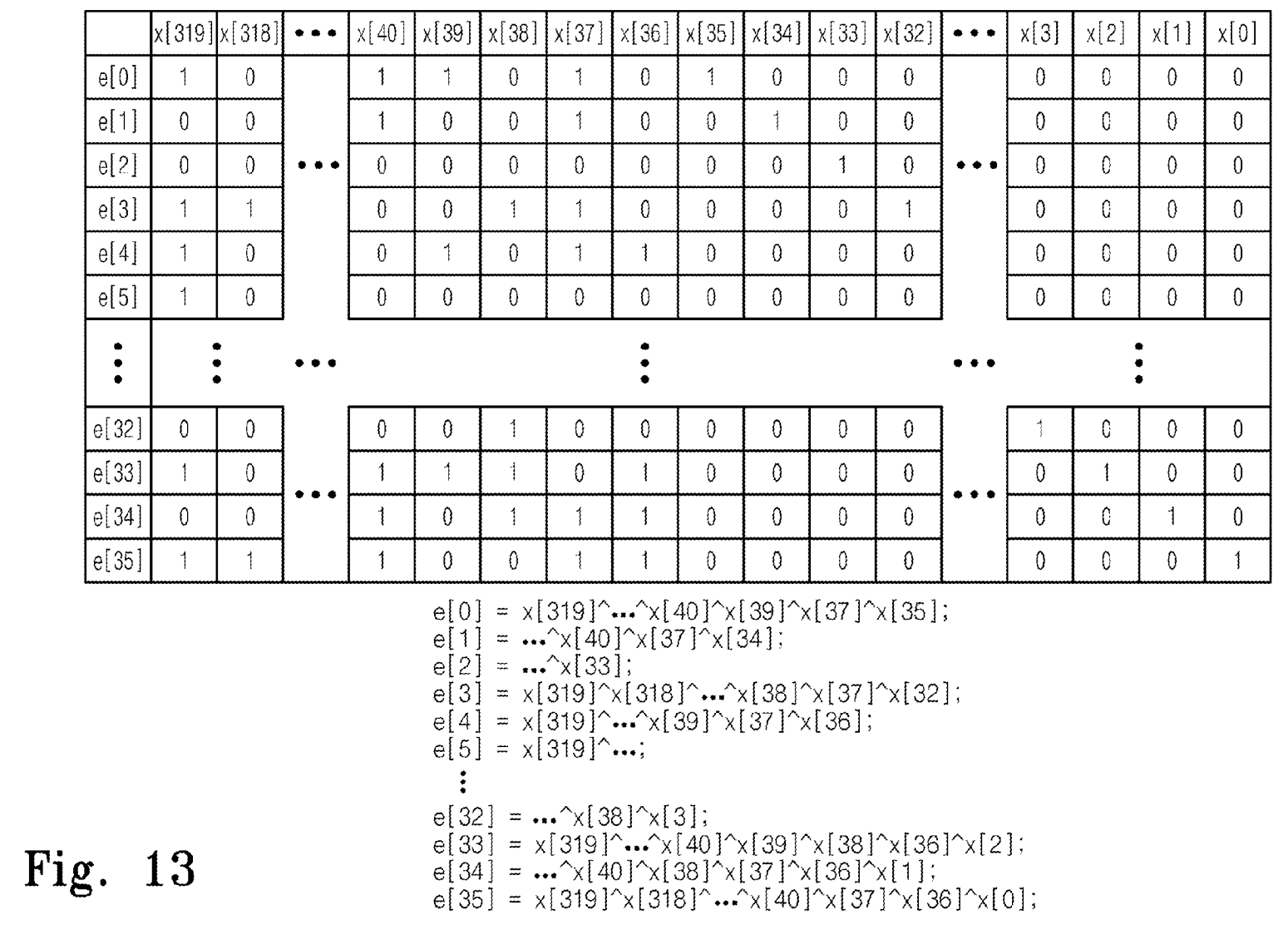

FIG. 13 is a table illustrating a calculation process of the syndrome calculator 31 of FIG. 3 according to example embodiments of the inventive concepts. Also, FIGS. 14 and 15 are conceptual diagrams illustrating the arrangement of the Chien search circuit 57 of FIG. 4. A bit position that each Chien search circuit 57 searches is determined depending on a value of i of the element $\alpha^i$ substituted to the error locator polynomial $\Lambda(x)$. When the plurality of Chien search circuits 57 are disposed in a matrix form as shown in FIG. 4 and an error search is performed on the BCH code of 320-bit including parity data, due to the characteristic of the BCH code, the matrix size becomes 512(=16×32) which is greater than 320. In this case, when each of the plurality of Chien search circuits 57 is disposed in the position of 0th bit to 320th bit, used bits and unused bits are irregularly mixed on the matrix.

FIG. 13 illustrates the case that the ECC circuit 13 detects and corrects an error by using the code data D1 instead of the extended code data D2. In more detail, FIG. 13 illustrates a calculation order of 36-bit data e[w](w=0, 1, . . . 35) calculated when the syndrome calculator 31 calculates a syndrome. It is assumed that 9 bits of e[w] form one syndrome and four syndromes S1, S3, S5, and S7 are calculated from e[w]. Each bit of e[w] is calculated by performing an exclusive-or operation on bits having a value of logic 1 among the bits x[319], . . . , x[0] in the table of FIG. 13.

FIG. 14 illustrates combinations of signals inputted to each Chien search circuit 57 when the error coefficient calculator 32 calculates coefficients of an error locator polynomial on the basis of syndromes calculated with reference to FIG. 13 and the Chien search unit 33 searches for an error bit by using the calculated coefficients. For example, a bit string signal dp0 calculated based on a semi-basis p0 and a bit string signal dq1 calculated based on a semi-basis q1 are provided to the Chien search circuit BIT0 performing the Chien search on the 0th bit.

FIG. 15 illustrates the case that the ECC circuit 13 detects and corrects an error by using the code data D1 instead of the extended code data D2. In more detail, FIG. 15 illustrate values that i of the element $\alpha^i$ can have, which corresponds to a bit position that each Chien search circuit 57 searches. Since the value of i is one of 0 to 510 but the length of the code data D1 is 320-bit, i having values other than 0 to 319 correspond to unused bits. The unused bits are in empty status. In FIG. 15, an empty box indicates an unused bit and a box including a number indicates a used bit. A number indicates a bit position. Due to the characteristic of the BCH code, the size of the matrix is 512(=16×32) which is greater than 320, and used bits and unused bits are irregularly mixed on the matrix. For example, bits lower than 319 are used and bits higher than 320 are not used in a 512 size matrix. The arrangement of FIG. 15 is inefficient in terms of a configuration of a semiconductor circuit. Moreover, according to the arrangement of FIG. 15, a circuit whose size is identical to that of a circuit whose number of valid bits is 512 is obtained.

Figure 16:
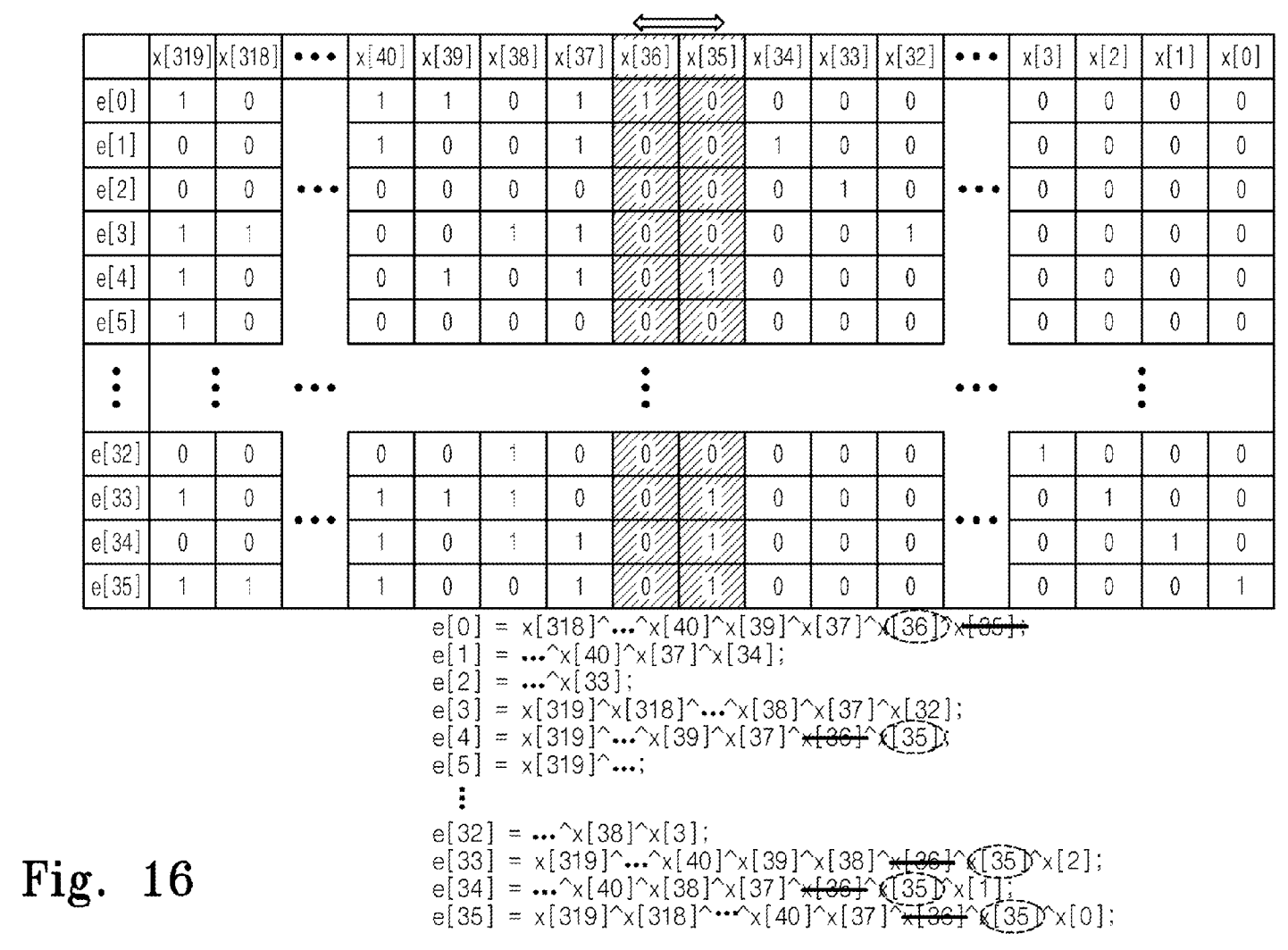
Figure 18:
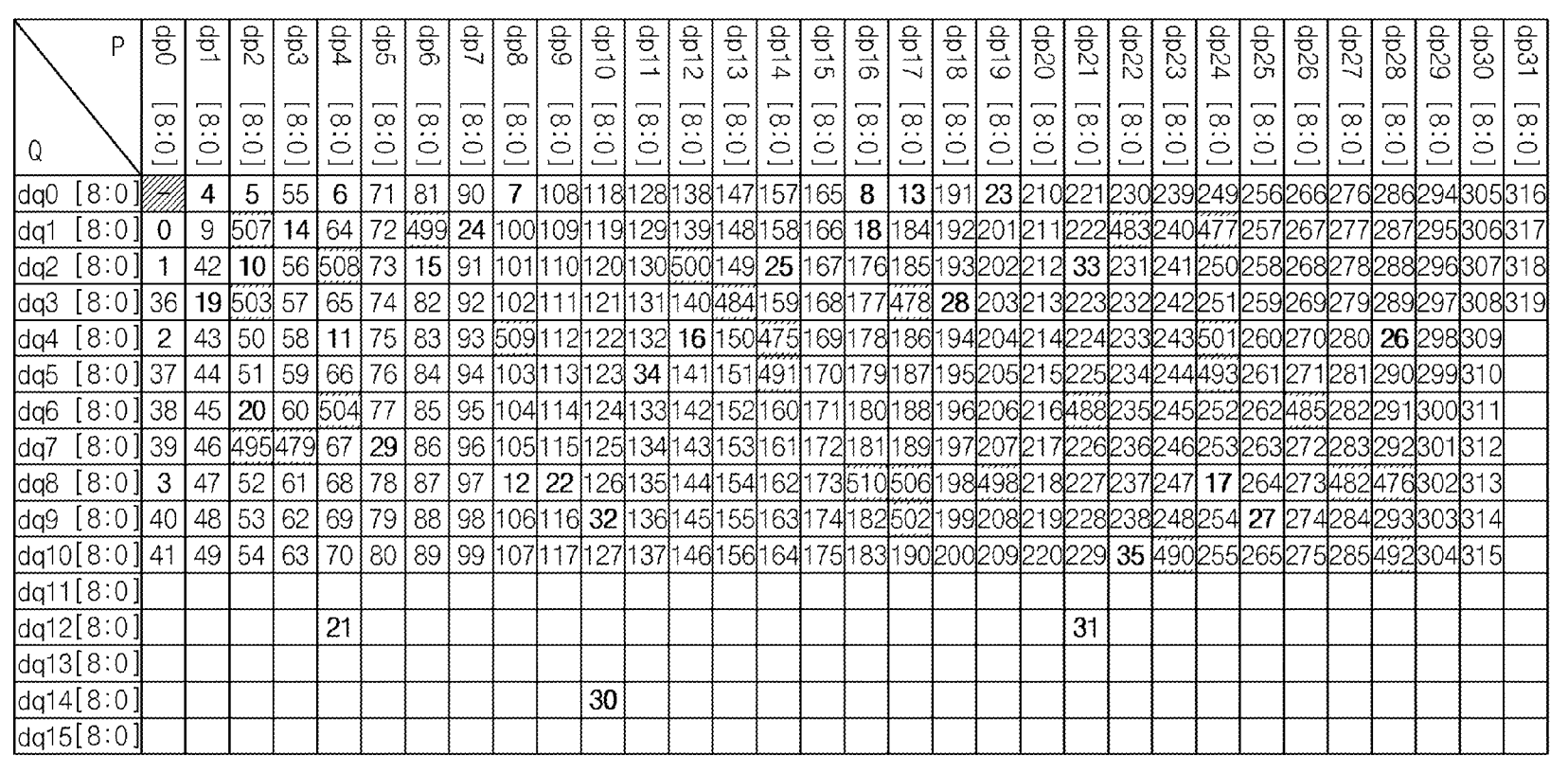

FIG. 16 is other table illustrating a calculation process of the syndrome calculator 31 of FIG. 3 according to example embodiments of the inventive concepts. Also, FIGS. 17 and 18 are other conceptual diagrams illustrating the arrangement of the Chien search circuit 57 of FIG. 4. Especially, FIGS. 16 to 18 illustrate the case that the ECC circuit 13 detects and corrects an error by using the extended code data D2 of 512-bit. For example, FIGS. 16 to 18 illustrate a process that each Chien search circuit 57 is arranged according to example embodiments of the inventive concepts.

When the code data D1 extend to the extended code data D2, the information data D11 of 256-bit is rearranged at a predetermined position on the extended information data D21 of 448-bit. Simultaneously, bits having a fixed logic value are added to empty 192 bits in the extended code data D2. Additionally, equations for calculating syndromes are changed to fit rearranged bits in order to maintain mathematical equivalence. For example, if the positions of the 35th bit and the 36th bit shown in the table of FIG. 13 are changed to each other, a table of FIG. 16 is obtained. Changed portions are indicated with a hatched box, values that are deleted from the expression for e[w] are indicated with a strike-out, and added values are surrounded by an ellipse. Additionally, the signal combinations of FIG. 14 are changed as shown in FIG. 17. Changed portions are underlined.

Referring to FIG. 18, the used bits are allocated from a box at the upper left in order. However, the positions of bits forming the added data D12 including parity data (i.e., the 0th to 35th bits in bold) are not used. Additionally, the positions of bits not used in the encoder (i.e., the 476th to 509th bits in the hatched positions) cannot be moved. Although complete rearrangement is not performed due to the above limitations, the rearrangement of FIG. 18 is more efficient compared to the arrangement of FIG. 15. When three bits (the 21st bit, the 30th bit, and the 31st bit) far from the other bits are relocated to the column dp31 during a semiconductor circuit arranging process, the size of a matrix is reduced. For example, lines corresponding to the columns dp4, dp10, and dp21 may be disposed in an area corresponding to the column dp31, and lines corresponding to the rows dq12 and dq14 may be disposed in areas corresponding to the rows dq4 to dq10. According to such example embodiments of the inventive concepts, the plurality of Chien search circuits 57 may be disposed in a matrix of size of about 11×32. For example, a circuit configured according to an example of FIG. 18 has an area reduced to about 11⁄16 compared to a circuit configured according to an example of FIG. 15. Additionally, since calculations for dq11, dq13, and dq15 become unnecessary, a circuit size is reduced, power consumption decreases, and a processing speed is improved.

According to example embodiments of the inventive concepts, rearrangement is performed to allow used bits or unused bits in the data including bits of more than $2^n$ and less than $2+1-1$ to be uniformly converged. Additionally, in order to maintain logical consistency, a logical structure of the parity generator or the syndrome calculator may be rearranged also. Especially, when additional bits have a fixed value of logic 0, costs for rearrangement are not increased.

The inventive concepts are not limited to the above configurations. The number of bits in the information data or the parity data may vary, a configuration of each block in block diagrams may be further divided, and a plurality of blocks may be integrated. Additionally, the ECC circuit of the inventive concepts may be applied when information is recorded on various recording media and information is read from various recording media.

Hereinafter, example embodiments of the inventive concepts are described. First, multiplication performed in a system adopting the Galois Field $GF(2^9)$ is described. In more detail, a process of multiplying two vectors X[8:0] and Y[8:0] to obtain a multiplication result Z[8:0] is described. For example, according to example embodiments of the inventive concepts, it is assumed that Galois Field $GF(2^9)$ uses 256-bit information data as a correction unit, and uses the BCH code for correcting a 4-bit error in the correction unit. It is assumed that the two vectors X[8:0] and Y[8:0] are expressed as follows.

$$X[8:0]=(x8,x7,x6,x5,x4,x3,x2,x1,x0)$$

$$Y[8:0]=(y8,y7,y6,y5,y4,y3,y2,y1,y0)$$

The two vectors are expressed as follows by polynomial expression.

$$X[8:0]=x8 \times X^8+x7 \times X^7+x6 \times X^6+x5 \times X^5+x4 \times X^4+x3 \times X^3+x2 \times X^2+x1 \times X^1+x0$$

$$Y[8:0]=y8 \times X^8+y7 \times X^7+y6 \times X^6+y5 \times X^5+y4 \times X^4+y3 \times X^3+y2 \times X^2+y1 \times X^1+y0$$

Each of the above X, x0 to x8, and y0 to y8 has a value of logic 0 or logic 1.

The multiplication result Z[8:0] obtained by multiplying the two vectors X[8:0] and Y[8:0] may be expressed as follows. A multiplication sign is omitted in the following expression.

$$\begin{aligned}Z[8:0] = &(x8y8) \times X^{16} + (x8y7 + x7y8) \times X^{15} + \\&(x8y6 + x7y7 + x7y8) \times X^{14} + (x8y5 + x7y6 + x6y7 + x5y8) \times X^{13} + \\&(x8y4 + x7y5 + x6y6 + x5y7 + x4y8) \times X^{12} + \\&(x8y3 + x7y4 + x6y5 + x5y6 + x4y7 + x3y8) \times X^{11} + \\&(x8y2 + x7y3 + x6y4 + x5y5 + x4y6 + x3y7 + x2y8) \times X^{10} + \\&(x8y1 + x7y2 + x6y3 + x5y4 + x4y5 + x3y6 + x2y7 + x1y8) \times X^{9} + \\&(x8y0 + x7y1 + x6y2 + x5y3 + x4y4 + x3y5 + x2y6 + x1y7 + x0y8) \times \\&X^{8} + (x7y0 + x6y1 + x5y2 + x4y3 + x3y4 + x2y5 + x1y6 + x0y7) \times \\&X^{7} + (x6y0 + x5y1 + x4y2 + x3y3 + x2y4 + x1y5 + x0y6) \times X^{6} + \\&(x5y0 + x4y1 + x3y2 + x2y3 + x1y4 + x0y5) \times X^{5} + \\&(x4y0 + x3y1 + x2y2 + x1y3 + x0y4) \times X^{4} + \\&(x3y0 + x2y1 + x1y2 + x0y3) \times X^{3} + \\&(x2y0 + x1y1 + x0y2) \times X^{2} + (x1y0 + x0y1) \times X^{1} + (x0y0)\end{aligned}$$

Figure 19:
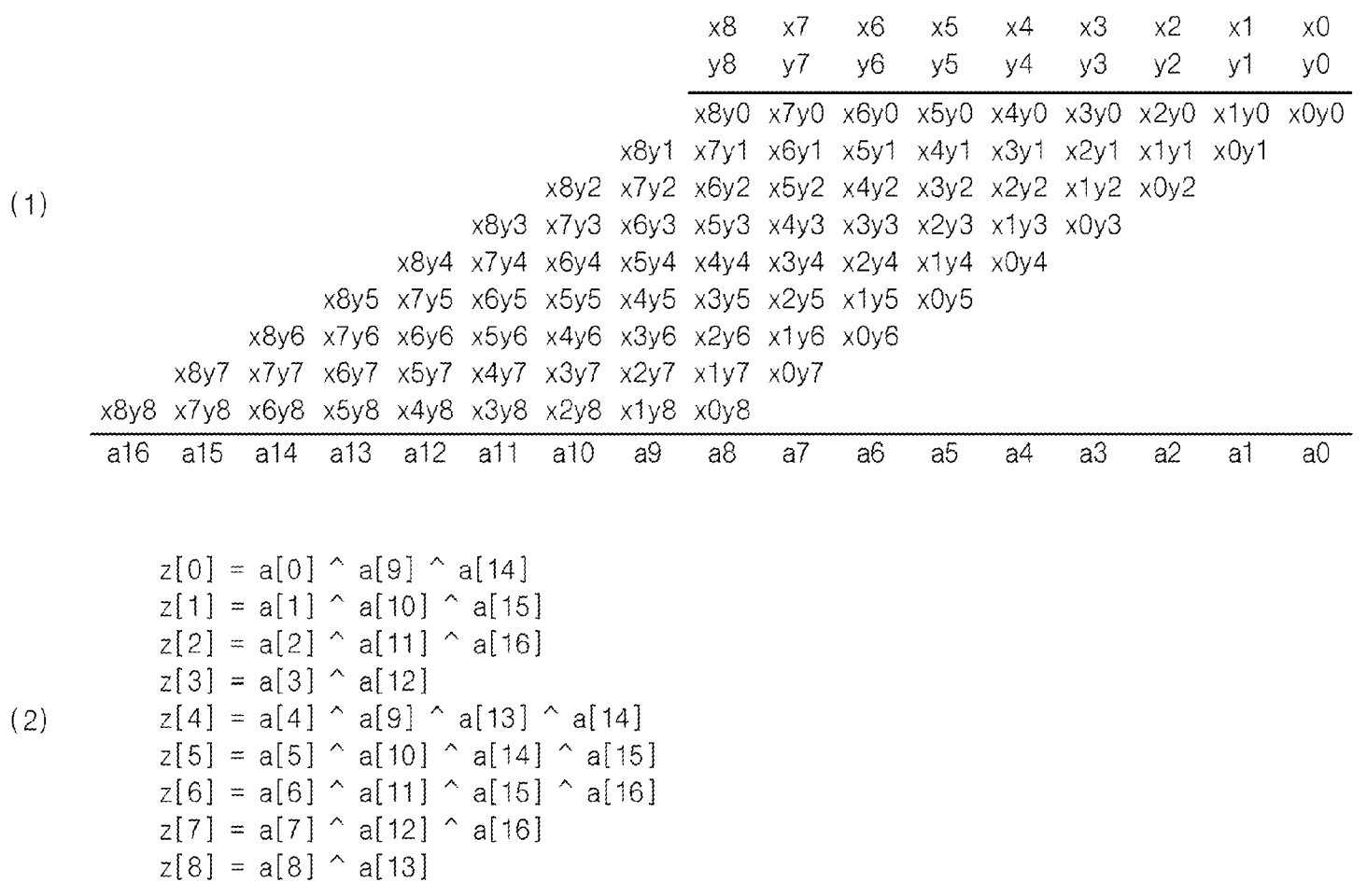

FIG. 19 is a conceptual diagram illustrating components of a vector Z[8:0]. Especially, FIG. 19(1) represents multiplication of components of the vector X[8:0] and components of the vector Y[8:0]. Additionally, FIG. 19(2) represents logical expressions to calculate each bit of Z[8:0] from a0 to a16 by using an exclusive-or operation.

Referring to FIG. 19(1), when multiplications of the components of the vector X[8:0] and the components of the vector Y[8:0] are added along a vertical direction, coefficients of each term in polynomial expression of Z[8:0] are obtained. a0 to a16 refer to the coefficients respectively corresponding to the $X^0$ term to the $X^{16}$ term in polynomial expression of Z[8:0]. For example, each of the following equations is satisfied.

$a16=x8y8$, $a15=x8y7+x7y8$, $a14=x8y6+x7y7+x7y8$, $a13=x8y5+x7y6+x6y7+x5y8$, $a12=x8y4+x7y5+x6y6+x5y7+x4y8$, $a11=x8y3+x7y4+x6y5+x5y6+x4y7+x3y8$, $a10=x8y2+x7y3+x6y4+x5y5+x4y6+x3y7+x2y8$, $a9=x8y1+x7y2+x6y3+x5y4+x4y5+x3y6+x2y7+x1y8$, $a8=x8y0+x7y1+x6y2+x5y3+x4y4+x3y5+x2y6+x1y7+x0y8$, $a7=x7y0+x6y1+x5y2+x4y3+x3y4+x2y5+x1y6+x0y7$, $a6=x6y0+x5y1+x4y2+x3y3+x2y4+x1y5+x0y6$, $a5=x5y0+x4y1+x3y2+x2y3+x1y4+x0y5$, $a4=x4y0+x3y1+x2y2+x1y3+x0y4$, $a3=x3y0+x2y1+x1y2+x0y3$, $a2=x2y0+x1y1+x0y2$, $a1=x1y0+x0y1$, $a0=x0y0$

Accordingly, Z[8:0] may be expressed in the following polynomial using a0 to a16.

$Z[8:0]=a16 \times X^{16}+a15 \times X^{15}+a14 \times X^{14}+a13 \times X^{13}+a12 \times X^{12}+a11 \times X^{11}+a10 \times X^{10}+a9 \times X^{9}+a8 \times X^{8}+a7 \times X^{7}+a6 \times X^{6}+a5 \times X^{5}+a4 \times X^{4}+a3 \times X^{3}+a2 \times X^{2}+a1 \times X^{1}+a0$ For example, when $X^9+X^4+1$ is employed as the irreducible polynomial (i.e., the primitive polynomial) of the Galois Field $GF(2^9)$, high order terms of more than $X^9$ may be expressed using terms having an order of less than $X^8$ as follows.

$X^9=X^4+1$, $X^{10}=X \times X^9=X^5+X$, $X^{11}=X \times X^{10}=X^6+X^2$, $X^{12}=X \times X^{11}=X^7+X^3$, $X^{13}=X \times X^{12}=X^8+X^4$, $X^{14}=X \times X^{13}=X^9+X^5=X^5+X^4+1$, $X^{15}=X \times X^{14}=X^6+X^5+X$, $X^{16}=X \times X^{15}=X^7+X^6+X^2$ After the above high order terms are substituted to the polynomial of Z[8:0] expressed using a0 to a16 and the expression is simplified, the following polynomial is obtained.

$$\begin{aligned}Z[8:0] = &(a8+a13) \times X^8 + (a7+a12+a16) \times X^7 + \\&(a6+a11+a15+a16) \times X^6 + (a5+a10+a14+a15) \times X^5 + \\&(a4+a9+a13+a14) \times X^4 + (a3+a12) \times X^3 + \\&(a2+a11+a16) \times X^2 + (a1+a10+a15) \times X^1 + (a0+a9+a14)\end{aligned}$$

While, Z[8:0] may be expressed as Z[8:0]=(z8, z7, z6, z5, z4, z3, z2, z1, z0) according to vector expression. By using the vector expression of Z[8:0], Z[8:0] may be expressed in the following polynomial.

$Z[8:0]=z8 \times X^8+z7 \times X^7+z6 \times X^6+z5 \times X^5+z4 \times X^4+z3 \times X^3+z2 \times X^2+z1 \times X^1+z0$ Accordingly, each of bits z[8] to z[0] of Z[8:0] is expressed as follows.

$z8=a8+a13$, $z7=a7+a12+a16$, $z6=a6+a11+a15+a16$, $z5=a5+a10+a14+a15$, $z4=a4+a9+a13+a14$, $z3=a3+a12$, $z2=a2+a11+a16$, $z1=a1+a10+a15$, $z0=a0+a9+a14$

For example, multiplication of two vectors may be performed as follows: (A) Perform exclusive-or operations on each bit in the most significant bits other than the m least significant bits (m=8 in the above example) of a multiplication result. (B) Convert a result of the exclusive-or operations to the vector expression of the m least significant bits on the basis of a given primitive polynomial. (C) Perform exclusive-or operations by using each element of them least significant bits converted to the vector expression and each element of the result obtained by performing the exclusive-or operations on each bit in the m least significant bits of the multiplication result.

When the steps (A), (B), and (C) are performed, each of the bits z[0] to z[8] of Z[8:0] is expressed as a result obtained by addition of the combinations of the sum (any one of a0 to a16) of a multiplication result of each bit of X[8:0] and each bit of Y[8:0].

In order to multiply each bit of X[8:0] and each bit of Y[8:0], 81(=9×9) AND circuits are required. In order to obtain the sum of the multiplication result of each bit of X[8:0] and each bit of Y[8:0] (i.e., any one of a0 to a16), exclusive-or circuits may be used. In order to obtain all of a0 to a16, 64 (=the number of AND circuits−17) exclusive-or circuits are required.

Additionally, in order to obtain each bit of Z[8:0] from a0 to a16, exclusive-or circuits may be used. FIG. 19(2) represents logical expressions to obtain each bit of Z[8:0] by performing exclusive-or operations on a0 to a16. In FIG. 19(2), a symbol ˆ means an exclusive-or operation. Additionally, in FIG. 19(2), each bit of Z[8:0] is expressed as z[0] to z[8], and a0 to a16 corresponding to the coefficients of the polynomial expression of Z[8:0] are expressed as a[0] to a[16]. In order to calculate the expressions shown in FIG. 19(2), 19 exclusive-or circuits are required.

According to the above description, each bit of Z[8:0] is obtained by 82 AND circuits for calculating multiplication of each bit of X[8:0] and each bit of Y[8:0], 64 exclusive-or circuits for calculating addition of the multiplication results (i.e., any one of a0 to a16), and 19 exclusive-or circuits for performing calculations according to logical expressions shown in FIG. 19(2). For example, each bit of Z[8:0] may be obtained by a total of 164 (=81+64+19) logical circuits.

Figure 26:
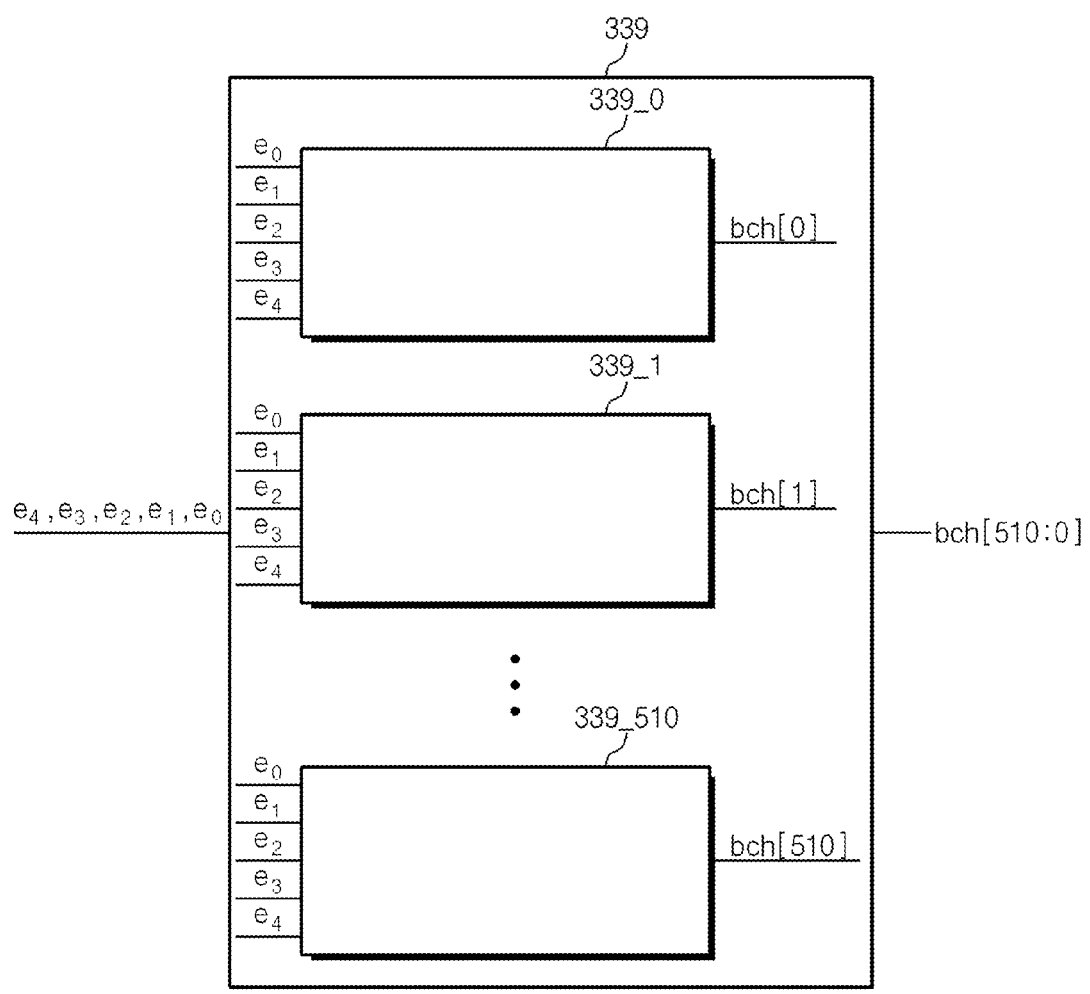
FIG. 26 is a block diagram illustrating a configuration of a Chien search unit according to the related art.

Meanwhile, when corrections for 511 bits are simultaneously performed in order to correct data fast, each of position search circuits 339_0 to 339_510 of FIG. 26 multiplies the coefficients $e_4$, $e_3$, $e_2$, and $e_1$ of the error locator polynomial and a power of the bit position x, and obtains the sum of the multiplication results. As mentioned above, each bit of Z[8:0] may be obtained through a total of 164 logical circuits. Furthermore, for example, the position search circuit 339_0 for the 0th bit requires four multipliers for each of the 164 logical circuits and performs addition on the 9-bit value four times. Accordingly, the position search circuit 339_0 requires 692(=164×4+9×4) logical circuits. As a result, all the position search circuits 339_0 to 339_510 require a total of 353612 (=692×511) logical circuits. According to example embodiments of the inventive concepts, the number of logical circuits in the position search circuit is drastically reduced, so that the scale of the position search circuit is reduced.

Example embodiments of the inventive concepts may include a plurality of position search circuits substituting elements of Galois Field $GF(2^9)$ to an error locator polynomial. According to example embodiments of the inventive concepts, an element in which only one bit has a value of logic 1 is substituted to each of the plurality of position search circuits. According to example embodiments of the inventive concepts, exclusive-or operations are performed on results obtained from each position search circuit.

Next, the elements (i.e., the above-mentioned X[8:0]) of the Galois Field $GF(2^9)$ in the case that the Galois Field $GF(2^9)$ and the BCH code for correcting a 4-bit error are used will be described. For description, the table of FIG. 7 is referenced again. FIG. 7 illustrates the elements of the Galois Field $GF(2^9)$ when $X^9+X^4+1$ is employed as a primitive polynomial. As mentioned above, the elements of the Galois Field $GF(2^9)$ are expressed in the polynomial expression and the vector expression as shown in FIG. 7.

Referring to FIG. 7, the 9 elements of $\alpha^0$ to $\alpha^8$ are elements whose only one bit has a value of logic 1. The 9 elements of $\alpha^0$ to $\alpha^8$ may be expressed as follows by the vector expression and the binary representation.

$\alpha^0=(0,0,0,0,0,0,0,0,1)=9'b000000001,$ $\alpha^1=(0,0,0,0,0,0,0,1,0)=9'b000000010,$ $\alpha^2=(0,0,0,0,0,0,1,0,0)=9'b000000100,$ $\alpha^3=(0,0,0,0,0,1,0,0,0)=9'b000001000,$ $\alpha^4=(0,0,0,0,1,0,0,0,0)=9'b000010000,$ $\alpha^5=(0,0,0,1,0,0,0,0,0)=9'b000100000,$ $\alpha^6=(0,0,1,0,0,0,0,0,0)=9'b001000000,$ $\alpha^7=(0,1,0,0,0,0,0,0,0)=9'b010000000,$ $\alpha^8=(1,0,0,0,0,0,0,0,0)=9'b100000000$ $\alpha^0$ to $\alpha^8$ are linearly independent elements that cannot be expressed by the other elements.

Additionally, by using the primitive polynomial $\alpha^9=\alpha^4+1$, the other 502 elements of $\alpha^9$ to $\alpha^{510}$ except for $\alpha^0$ to $\alpha^8$ are expressed as the following expressions.

$\alpha^9=\alpha^4 1,$ $\alpha^{10}=\alpha^9\alpha^1=(\alpha^4+1)\alpha=\alpha^5+\alpha,$ $\alpha^{11}=\alpha^{10}\alpha^1=(\alpha^5+1)\alpha=\alpha^6+\alpha^2,$ $\alpha^{12}=\alpha^{11}\alpha^1=(\alpha^6+\alpha^2)\alpha=\alpha^7+\alpha^3,$ $\alpha^{13}=\alpha^{12}\alpha^1=(\alpha^7+\alpha^3)\alpha=\alpha^8+\alpha^4,$ $\alpha^{14}=\alpha^{13}\alpha^1=(\alpha^8+\alpha^4)\alpha=\alpha^9+\alpha^5=\alpha^5+\alpha^4+1,$ $\alpha^{15}=\alpha^{14}\alpha^1=(\alpha^5+\alpha^4+1)\alpha=\alpha^6+\alpha^5+\alpha,$ $\alpha^{16}=\alpha^{15}\alpha^1=(\alpha^6+\alpha^5+\alpha)\alpha=\alpha^7+\alpha^6+\alpha^2,$ $\alpha^{17}=\alpha^{16}\alpha^1=(\alpha^7+\alpha^6+\alpha^2)\alpha=\alpha^8+\alpha^7+\alpha^3,$ $\alpha^{18}=\alpha^{17}\alpha^1=(\alpha^8+\alpha^7\alpha^3)\alpha=\alpha^9+\alpha^8+\alpha^4=\alpha^4+1+\alpha^8+\alpha^4=\alpha^8+1,$ $\alpha^{19}=\alpha^{18}\alpha^1=(\alpha^8+1)\alpha=\alpha^9+\alpha=\alpha^4\alpha+1,$

...

$\alpha^{510}=\alpha^{509}\alpha^1=(\alpha^7+\alpha^2)\alpha=\alpha^8+\alpha^3,$ For example, each of the elements of $\alpha^9$ to $\alpha^{510}$ may be obtained by adding at least two of the 9 elements of $\alpha^0$ to $\alpha^8$.

Then, a method of generating elements in which only one bit has a value of logic 1 will be described. This method may be used for a process of obtaining Z[8:0] by multiplying X[8:0] and Y[8:0], for example, a process of calculating multiplication of a coefficient and the element. For example, $X[8:0]$ may correspond to the elements of $\alpha^0$ to $\alpha^{510}$ of the Galois Field $GF(2^9)$. Additionally, $Y[8:0]$ may correspond to the coefficients of the error locator polynomial (one of $e_1$, $e_2$, $e_3$, and $e_4$ according to an order). Moreover, $Z[8:0]$ may correspond to a multiplication result of the coefficient and the element ($e_1x$, $e_2x^2$, $e_3x^3$, and $e_4x^4$ according to an order).

For example, a process of obtaining $e_1x$ (i.e., multiplication of the coefficient and the element) will be described. As mentioned above, $z[0]$ in $Z[8:0]$ may be expressed as $z[0]=a0+a9+a14$. When the elements of $X[8:0]$ and $Y[8:0]$ are used, $z[0]$ is expressed as follows.

$$z[0]=y0x0+y8x1+y7x2+y6x3+y5x4+y4x5+(y3+y8)x6+(y2+y7)x7+(y1+y6)x8$$

In the above expression, when $y3+y8$ is replaced with p0, $y2+y7$ is replaced with p1, and $y1+y6$ is replaced with p2, $z[0]$ is expressed as follows.

$$z[0]=y0x0+y8x1+y7x2+y6x3+y5x4+y4x5+p0x6+p1x7+p2x8$$

Also, $z[1]$ in $Z[8:0]$ may be expressed as $z[1]=a1+a10+a15$. When the elements of $X[8:0]$ and $Y[8:0]$ are used, $z[1]$ is expressed as follows.

$$z[1]=y1x0+y0x1+y8x2+y7x3+y6x4+y5x5+y4x6+(y3+y8)x7+(y2+y7)x8$$

In the above expression, when $y3+y8$ is replaced with p0 and $y2+y7$ is replaced with p1, $z[1]$ is expressed as follows.

$$z[1]=y1x0+y0x1+y8x2+y7x3+y6x4+y5x5+y4x6+p0x7+p1x8$$

Also, $z[2]$ in $Z[8:0]$ may be expressed as $z[2]=a2+a11+a16$. When the elements of $X[8:0]$ and $Y[8:0]$ are used, $z[2]$ is expressed as follows.

$$z[2]=y2x0+y1x1+y0x2+y8x3+y7x4+y6x5+y5x6+y4x7+(y3+y8)x8$$

In the above expression, when $y3+y8$ is replaced with p0, $z[2]$ is expressed as follows.

$$z[2]=y2x0+y1x1+y0x2+y8x3+y7x4+y6x5+y5x6+y4x7+p0x8$$

Also, $z[3]$ in $Z[8:0]$ may be expressed as $z[3]=a3+a12$. When the elements of $X[8:0]$ and $Y[8:0]$ are used, $z[3]$ is expressed as follows.

$$z[3]=y3x0+y2x1+y1x2+y0x3+y8x4+y7x5+y6x6+y5x7+y4x8$$

Also, $z[4]$ in $Z[8:0]$ may be expressed as $z[4]=a4+a9+a13+a14$. When the elements of $X[8:0]$ and $Y[8:0]$ are used, $z[4]$ is expressed as follows.

$$z[4]=y4x0+(y3+y8)x1+(y2+y7)x2+(y1+y6)x3+(y0+y5)x4+(y4+y8)x5+(y3+y7+y8)x6+(y2+y6+y7)x7+(y1+y5+y6)x8$$

In the above expression, when $y3+y8$ is replaced with p0, $y2+y7$ is replaced with p1, $y1+y6$ is replaced with p2, $y0+y5$ is replaced with p3, $y4+y8$ is replaced with p4, $y3+y7+y8$ is replaced with p5, $y2+y6+y7$ is replaced with p6, and $y1+y5+y6$ is replaced with p'7, $z[4]$ is expressed as follows.

$$z[4]=y4x0+p0x1+p1x2+p2x3+p3x4+p4x5+p5x6+p6x7+p7x8$$

Also, $z[5]$ in $Z[8:0]$ may be expressed as $z[5]=a5+a10+a14+a15$. When the elements of $X[8:0]$ and $Y[8:0]$ are used, $z[5]$ is expressed as follows.

$$z[5]=y5x0+y4x1+(y3+y8)x2+(y2+y7)x3+(y1+y6)x4+(y0+y5)x5+(y4+y8)x6+(y3+y7+y8)x7+(y2+y6+y7)x8$$

In the above expression, when $y3+y8$ is replaced with p0, $y2+y7$ is replaced with p1, $y1+y6$ is replaced with p2, $y0+y5$ is replaced with p3, $y4+y8$ is replaced with p4, $y3+y7+y8$ is replaced with p5, and $y2+y6+y7$ is replaced with p6, $z[5]$ is expressed as follows.

$$z[5]=y5x0+y4x1+p0x2+p1x3+p2x4+p3x5+p4x6+p5x7+p6x8$$

Also, $z[6]$ in $Z[8:0]$ may be expressed as $z[6]=a6+a11+a15+a16$. When the elements of $X[8:0]$ and $Y[8:0]$ are used, $z[6]$ is expressed as follows.

$$z[6]=y6x0+y5x1+y4x2+(y3+y8)x3+(y2+y7)x4+(y1+y6)x5+(y0+y5)x6+(y4+y8)x7+(y3+y7+y8)x8$$

In the above expression, when $y3+y8$ is replaced with p0, $y2+y7$ is replaced with p1, $y1+y6$ is replaced with p2, $y0+y5$ is replaced with p3, $y4+y8$ is replaced with p4, and $y3+y7+y8$ is replaced with p5, $z[6]$ is expressed as follows.

$$z[6]=y6x0+y5x1+y4x2+p0x3+p1x4+p2x5+p3x6+p4x7+p5x8$$

Also, $z[7]$ in $Z[8:0]$ may be expressed as $z[7]=a7+a12+a16$. When the elements of $X[8:0]$ and $Y[8:0]$ are used, $z[7]$ is expressed as follows.

$$z[7]=y7x0+y6x1+y5x2+y4x3+(y3+y8)x4]+(y2+y7)x5+(y1+y6)x6+(y0+y5)x7+(y4+y8)x8$$

In the above expression, when $y3+y8$ is replaced with p0, $y2+y7$ is replaced with p1, $y1+y6$ is replaced with p2, $y0+y5$ is replaced with p3, and $y4+y8$ is replaced with p4, $z[7]$ is expressed as follows.

$$z[7]=y7x0+y6x1+y5x2+y4x3+p0x4+p1x5+p2x6+p3x7+p4x8$$

Also, $z[8]$ in $Z[8:0]$ may be expressed as $z[8]=a8+a13$. When the elements of $X[8:0]$ and $Y[8:0]$ are used, $z[8]$ is expressed as follows.

$$z[8]=y8x0+y7x1+y6x2+y5x3+y4x4+(y3+y8)x5+(y2+y7)x6+(y1+y6)x7+(y0+y5)x8$$

In the above expression, when $y3+y8$ is replaced with p0, $y2+y7$ is replaced with p1, $y1+y6$ is replaced with p2, and $y0+y5$ is replaced with p3, $z[8]$ is expressed as follows.

$$z[8]=y8x0+y7x1+y6x2+y5x3+y4x4+p0x5+p1x6+p2x7+p3x8$$

Figure 21:
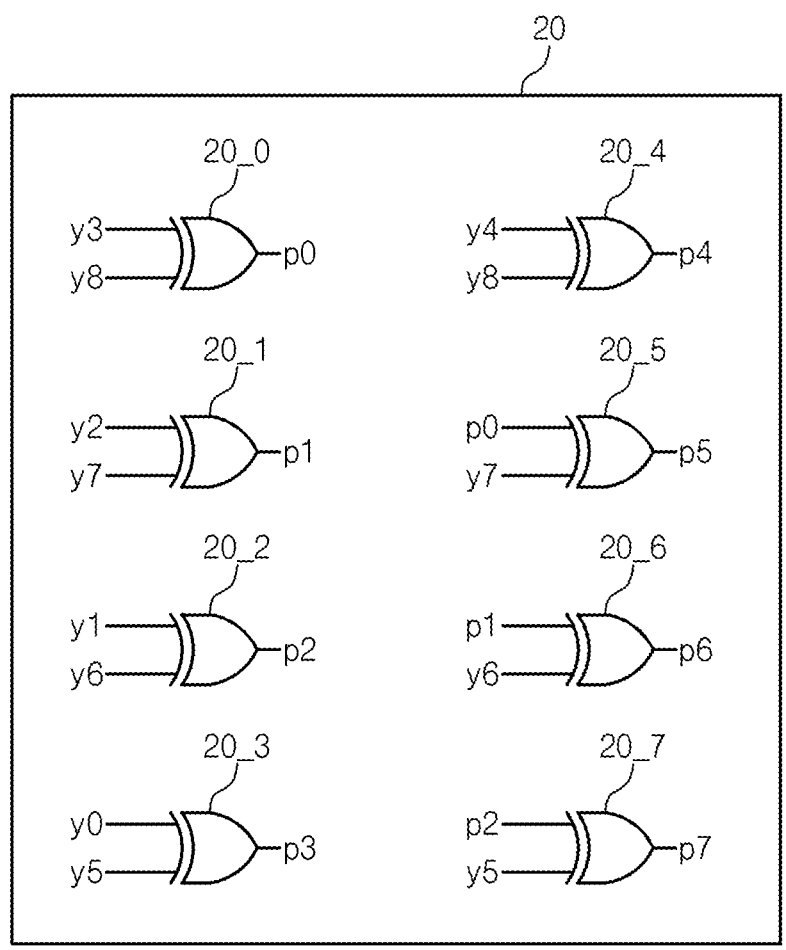
FIG. 21 is a view of expressions illustrating a process of obtaining values of p[0] to p[7] from a combination of y[0] to y[8], and a diagram illustrating a p generator for obtaining values of p[0] to p[7] from a combination of y[0] to y[8]

In order to calculate the above expressions, exclusive-or operations may be performed on y[8] to y[0], and a combination of each bit of $Y[8:0]$ may be obtained. Each of the bits $z[0]$ to $z[8]$ of $Z[8:0]$ is obtained by performing AND operations on each bit of $X[8:0]$ and each bit of $Y[8:0]$ or a combination of each bit and performing an exclusive-or operation on the ADD operation results. A calculation process for obtaining $z[0]$ to $z[8]$ is summarized in FIGS. 20 and 21. FIG. 20 is a table illustrating a process of calculating $Z[8:0]$ obtained by multiplying $X[8:0]$ and $Y[8:0]$. Additionally, FIG. 21 is a view of expressions illustrating a process of obtaining values of $p[0]$ to $p[7]$ from a combination of y[0] to y[8], and a diagram illustrating a p generator for obtaining values of $p[0]$ to $p[7]$ from a combination of y[0] to y[8].

The p generator 20 may include exclusive-or circuits 20_0 to 20_7. The exclusive-or circuit 20_0 may receive y[3] in $Y[8:0]$ through a first input, and receive y[8] in $Y[8:0]$ through a second input. The exclusive-or circuit 20_0 may perform an exclusive-or operation on the received two signals to generate $y3+y8$, i.e., p0. The exclusive-or circuit 20_1 may receive y[2] in $Y[8:0]$ through a first input, and receive y[7] in $Y[8:0]$ through a second input. The exclusive-or circuit 20_1 may perform an exclusive-or operation on the received two signals to generate y2+y7, i.e., p1. The exclusive-or circuit 20_2 may receive y[1] in Y[8:0] through a first input, and receive y[6] in Y[8:0] through a second input. The exclusive-or circuit 20_2 may perform an exclusive-or operation on the received two signals to generate y1+y6, i.e., p2. The exclusive-or circuit 20_3 may receive y[0] in Y[8:0] through a first input, and receive y[5] in Y[8:0] through a second input. The exclusive-or circuit 20_3 may perform an exclusive-or operation on the received two signals to generate y0+y5, i.e., p3. The exclusive-or circuit 20_4 may receive y[4] in Y[8:0] through a first input, and receive y[8] in Y[8:0] through a second input. The exclusive-or circuit 20_4 may perform an exclusive-or operation on the received two signals to generate y4+y8, i.e., p4.

The exclusive-or circuit 20_5 may receive p0 generated by the exclusive-or circuit 20_0 through a first input, and receive y[7] in Y[8:0] through a second input. The exclusive- or circuit 20_5 may perform an exclusive-or operation on the received two signals to generate y3+y7+y8, i.e., p5. The exclusive-or circuit 20_6 may receive p1 generated by the exclusive- or circuit 20_1 through a first input, and receive y[6] in Y[8:0] through a second input. The exclusive-or circuit 20_6 may perform an exclusive-or operation on the received two signals to generate y2+y6+y7, i.e., p6. The exclusive-or circuit 20_7 may receive p2 generated by the exclusive-or circuit 20_2 through a first input, and receive y[5] in Y[8:0] through a second input. The exclusive-or circuit 20_7 may perform an exclusive-or operation on the received two signals to generate y1+y5+y6, i.e., p7. For example, the p generator 20 may generate p[0] to p[8] by the combinations of y[0] to y[8] of Y[8:0].

Accordingly, each bit of Z[8:0] is obtained based on each of the bits x[0] to x[8] of X[8:0] and each of the bits y[0] to y[8] of Y[8:0] or p[0] to p[8] which are combinations of y[0] to y[8]. In example embodiments of the inventive concepts, the vector X[8:0] is a 9-bit vector. Additionally, the vector Y[8:0] is configured with a 9-bit vector where some bits of the 9 bits in Y[8:0] and some combined bits of the 9 bits in Y[8:0] are unified.

For example, it is assumed that X[8:0] corresponds to the 9 elements of $\alpha^0$ to $\alpha^8$ whose only one bit has a value of logic 1. Additionally, it is assumed that Y[8:0] corresponds to the coefficient vector $e_1 = (e_{18}, e_{17}, e_{16}, e_{15}, e_{14}, e_{13}, e_{12}, e_n, e_{10})$ of the coefficients of the error locator polynomial. Under the above assumptions, multiplication of one of the 9 elements of $\alpha^0$ to $\alpha^8$ and the coefficient vector $e_1$ is expressed as follows.

$e_1\alpha^0 = (e_{18}, e_{17}, e_{16}, e_{15}, e_{14}, e_{13}, e_{12}, e_{11}, e_{10})$ $e_1\alpha^1 = (e_{17}, e_{16}, e_{15}, e_{14}, (e_{13}+e_{18}), e_{12}, e_{11}, e_{10}, e_{18})$ $e_1\alpha^2 = (e_{16}, e_{15}, e_{14}, (e_{13}+e_{18}), (e_{12}+e_{17}), e_{11}, e_{10}, e_{18}, e_{17})$ $e_1\alpha^3 = (e_{15}, e_{14}, (e_{13}+e_{18}), (e_{12}+e_{17}), (e_{11}+e_{16}), e_{10}, e_{18}, e_{17}, e_{16})$ $e_1\alpha^4 = (e_{14}, (e_{13}+e_{18}), (e_{12}+e_{17}), (e_{11}+e_{16}), (e_{10}+e_{15}), e_{18}, e_{17}, e_{16}, e_{15})$ $e_1\alpha^5 = ((e_{13}+e_{18}), (e_{12}+e_{17}), (e_{11}+e_{16}), (e_{10}+e_{15}), (e_{14}+e_{18}), e_{17}, e_{16}, e_{15}, e_{14})$ $e_1\alpha^6 = ((e_{12}+e_{17}), (e_{11}+e_{16}), (e_{10}+e_{15}), (e_{14}+e_{18}), (e_{13}+e_{17}+e_{18}), e_{16}, e_{15}, e_{14}, (e_{13}+e_{18}))$ $e_1\alpha^7 = ((e_{11}+e_{16}), (e_{10}+e_{15}), (e_{14}+e_{18}), (e_{13}+e_{17}+e_{18}), (e_{12}+e_{16}+e_{17}), e_{15}, e_{14}, (e_{13}+e_{18}), (e_{12}e_{17}))$ $e_1\alpha^8 = ((e_{10}+e_{15}), (e_{14}+e_{18}), (e_{13}+e_{17}+e_{18}), (e_{12}+e_{16}+e_{17}), (e_{11}+e_{15}+e_{16}), e_{14}, (e_{13}+e_{18}), (e_{12}+e_{17}), (e_{11}+e_{16}))$ For example, multiplication of an element whose only one bit has a value of logic 1 and the coefficient vector $e_1$ may be obtained by using each bit of the coefficient vector $e_1$ or combining each bit of the coefficient vector $e_1$. Each bit of a coefficient vector may be calculated by an error coefficient calculator 32 described later. Accordingly, a position search circuit may require exclusive-or circuits for calculating combinations of each bit of the coefficient vector $e_1$. The exclusive-or circuits in the position search circuit may be used to calculate expressions in FIG. 21(1) and may have the same configurations as the p generator 20 of FIG. 21(2). The p generator 20 may include 8 exclusive-or circuits. Multiplication of each of the other 502 elements of $\alpha^9$ to $\alpha^{510}$ except for the elements whose only one bit has a value of logic 1 and the coefficient vector $e_1$ may be calculated by the position search circuit.

FIG. 22 is a table illustrating expressions for obtaining multiplication of X[8:0]=(1, 0, 1, 0, 1, 0, 1, 0, 1) and the coefficient vector $e_1$ by using the elements whose only one bit has a value of logic 1.

X[8:0]=(1, 0, 1, 0, 1, 0, 1, 0, 1) may be expressed as $\alpha^8+\alpha^6+\alpha^4+\alpha^2+\alpha^0$. Accordingly, multiplication of X[8:0]=(1, 0, 1, 0, 1, 0, 1, 0, 1) and the coefficient vector $e_1$ may be expressed as the following logical expression on the basis of the elements whose only one bit has a value of logic 1 and the coefficient vector $e_1$.

$$X[8:0] \times e_1 =$$
$$(1, 0, 1, 0, 1, 0, 1, 0, 1) \times e_1 = e_1\alpha^0 + e_1\alpha^2 + e_1\alpha^4 + e_1\alpha^6 + e_1\alpha^8 =$$
$$(e_{18} + e_{16} + e_{14} + (e_{12} + e_{17}) + (e_{10} + e_{15}),$$
$$e_{17} + e_{15} + (e_{13} + e_{18}) + (e_{11} + e_{16}) + e_{14} + e_{18}),$$
$$e_{16} + e_{14} + (e_{12} + e_{17}) + (e_{10} + e_{15}) + (e_{13} + e_{17} + e_{18}),$$
$$e_{15} + (e_{13} + e_{18}) + (e_{11} + e_{16}) + (e_{14} + e_{18}) + (e_{12} + e_{16} + e_{17}),$$
$$e_{14} + (e_{12} + e_{17}) + (e_{10} + e_{15}) + (e_{13} + e_{17} + e_{18}) + (e_{11} + e_{15} + e_{16}),$$
$$e_{13} + e_{11} + e_{18} + e_{16} + e_{14},$$
$$e_{12} + e_{10} + e_{17} + e_{15} + (e_{13} + e_{18}),$$
$$e_{11} + e_{18} + e_{16} + e_{14} + (e_{12} + e_{17}),$$
$$e_{10} + e_{17} + e_{15} + (e_{13} + e_{18}) + (e_{11} + e_{16}))$$

For example, each of the 502 elements of $\alpha^9$ to $\alpha^{510}$ may be expressed by using the elements whose only one bit has a value of logic 1 and the coefficient vector $e_1$. Therefore, each of the 502 elements of $\alpha^9$ to $\alpha^{510}$ may be also expressed by each bit of the coefficient vector $e_1$ or the combination of each bit of the coefficient vector $e_1$.

According to the form of the expression, it looks that four exclusive-or circuits are needed to calculate X[8:0]×$e_1$. However, addition of one element whose three bits have a value of logic 1 among $\alpha^9$ to $\alpha^{510}$ and one element whose two bits have a value of logic 1 among $\alpha^9$ to $\alpha^{510}$ or addition of one element whose only one bit has a value of logic 1 and one element whose four bits have a value of logic 1 among $\alpha^9$ to $\alpha^{510}$ may be required. Accordingly, a position search circuit includes nine exclusive-or circuits.

For example, multiplication of each of the elements $\alpha^{14}$, $\alpha^{15}$, and $\alpha^{16}$ whose three bits have a value of logic 1 and $e_1$ may be expressed as follows.

$e_1\alpha^{14} = e_1(\alpha^5+\alpha^4+1) = e_1(\alpha^5+\alpha^9)$ $e_1\alpha^{15} = e_1(\alpha^6+\alpha^5+\alpha) = e_1(\alpha^6+\alpha^{10})$ $e_1\alpha^{16} = e_1(\alpha^7+\alpha^6+\alpha^2) = e_1(\alpha^7+\alpha^{11})$ The above calculations may be performed by adding the multiplication results of one of the 511 elements of $\alpha^0$ to $\alpha^{510}$ and the coefficient vector $e_1$. Multiplication of each of the other elements except for $\alpha^{14}$, $\alpha^{15}$, $\alpha^{16}$ and $e_1$ also may be calculated by adding the multiplication results of one of the 511 elements of $\alpha^0$ to $\alpha^{510}$ and the coefficient vector $e_1$. Accordingly, 9 exclusive-or circuits for calculating addition of 9-bit may be required.

As mentioned above, the multiplication of the 9 elements whose only one bit has a value of logic 1 and the coefficient vector $e_1$ may be calculated by 8 exclusive-or circuits. Also, the multiplication of the 502 elements except for the 9 elements whose only one bit has a value of logic 1 and the coefficient vector $e_1$ may be calculated by 9×502 exclusive-or circuits. As a result, 4526 (=8+9×502) exclusive-or circuits may be required. Additionally, each position search circuit for obtaining the multiplication of each of the 511 elements of $\alpha^0$ to $\alpha^{510}$ and other coefficient vectors $e_2$, $e_3$, $e_4$ may require 4526 exclusive-or circuits. Accordingly, 4 position search circuits may be configured with 18104 (=4526×4) logical circuits.

A Chien search unit may perform operations for adding outputs (9 bits×511) of each of four position search circuits. Therefore, in order to generate error detection signals, 18396 (=4×9×511) exclusive-or circuits may be required. Accordingly, the Chien search unit may require 36824(=18428+18396) logical circuits. Compared to the Chien search unit of the related art requiring 353612 logical circuits, the Chien search unit according to example embodiments of the inventive concepts may require logical circuits whose number is reduced to 1/10.

The multiplication performed by adopting the Galois Field $GF(2^9)$ according to example embodiments of the inventive concepts are described. Next, a configuration of a circuit performing error detection and error correction according to an example embodiments of the inventive concepts will be described.

Example embodiments of the inventive concepts are described with reference to FIG. 1 again. The nonvolatile semiconductor memory device 10 of FIG. 1 may operate according to example embodiments of the inventive concepts.

As was discussed above with reference to FIG. 1, the memory cell array 11 may include a plurality of transistors of a stack gate structure. The memory cell array 11 may include a block where electrically rewritable nonvolatile memory cells are connected in series along a column direction so that NAND cell strings disposed at each bit line are arranged along a row direction. A plurality of the blocks may be disposed along a direction that a bit line is extended. Additionally, the block may be configured as an erase unit of a memory cell. A word line lying at right angles to a bit line may be commonly connected to a gate of each nonvolatile memory disposed at the same row of each block. Nonvolatile memory cells selected by one word line may form a page which is a program/read unit.

As was discussed above with reference to FIG. 1, the page buffer 12 may include at least one page buffer circuit. The page buffer circuit may program or read data by a page unit. Each of the page buffer circuit may be connected to a bit line. The page buffer circuit may include a latch used as a sense amplifier that amplifies a voltage of a connected bit line and determine a logic value of the voltage. During a read operation of the nonvolatile semiconductor memory device 10, cell data including data stored in a memory cell of one page of the memory cell array 11 may be provided to the page buffer 12. The page buffer 12 may amplify the cell data and provide the cell data to the ECC circuit 13.

Meanwhile, during a program operation of the nonvolatile semiconductor memory device 10, the page buffer 12 may store data provided from the ECC circuit 13 in the latch therein. The page buffer 12 may store all data as code data in a memory cell of one page while verifying the stored data.

The code data may include parity data that the ECC circuit 13 generates. For example, it is assumed that an error correction system for correcting a 4-bit error in information data of 32-byte by using the BCH code is used. One page may include memory cells for storing typical data of 16 k(=16384) bits and memory cells for storing parity data of 2304 bits, i.e., a total of 2K(=2048) bytes. For example, the cell data and the code data may be configured with (16384+2304) bits. Additionally, one page may be divided into sectors as a correction unit of the ECC circuit 13. For example, it is assumed that one page is divided into 64 sectors. Data corresponding to one sector may include typical data of 32 bytes (=256 bits) and parity data of 36 bits.

According to example embodiments of the inventive concepts, typical data stored in a memory may be accessed by an external device according to an input of a column address. However, since parity data are internal data added to correct typical data, they may not be directly accessed by the external device.

The ECC circuit 13 may process data read from the page buffer 12 by each sector during a read operation of the nonvolatile semiconductor memory device 10. The ECC circuit 13 may calculate coefficients of an error locator polynomial and stores the calculated coefficients in a latch therein. Additionally, the ECC circuit 13 may correct an error of data of a bit whose position is indicated by a column address and may store the corrected data in the buffer 14 during a read operation. The ECC circuit 13 may output the corrected data to the outside of the device through the I/O pad 15. For instance, by disposing an I/O circuit between the I/O pad 15 and the ECC circuit 13, data may be outputted to the outside of the device.

Additionally, the ECC circuit 13 may receive information data provided from the I/O pad 15 through the buffer 14 during a program operation of the nonvolatile semiconductor memory device 10. The ECC circuit 13 may generate parity data on the basis of the information data. The ECC circuit 13 may provide the information data and the parity data to the page buffer 12. The page buffer 12 may store the received data as the code data in a memory cell of a selected page.

The controller 16 may receive various control signals and control program, read, and erase operations and validation on a nonvolatile memory cell. For example, the control signals may include an external clock signal, a chip enable signal /CE, a read enable signal /RE, a program enable signal /WE, a command latch enable signal CLE, an address latch enable signal ALE, and a program prohibit signal /WP. The controller 16 may generate internal control signals according to an operation mode that the control signals and command data inputted to the I/O pad 15 indicate. For example, at the rising edge of the program enable signal /WE, since the voltage of the command latch enable signal CLE changes from a low level into a high level, the controller 16 receives command data from the I/O pad 15 and then stores the received data in a register therein.

The address decoder 17 may store an address (e.g., a row address or a block address) inputted from the I/O pad 15 in response to the internal control signals provided from the controller 16. Moreover, the address decoder 17 may provide the stored address to the row/block decoder 18, the page buffer 12, and the ECC circuit 13 in response to the internal control signals provided from the controller 16. For example, at the rising edge of the program enable signal /WE, since the voltage of the address latch enable signal ALE changes from a low level into a high level, the controller 16 receives the address from the I/O pad 15 and then stores the received address in an internal register of the address decoder 17.

The row/block decoder 18 may select a memory cell in a page by selecting a block and a word line of the memory cell array 11 according to a row address and a block address stored in the address decoder 17. Furthermore, the address decoder 17 may select a bit line of the memory cell array 11 and the page buffer 12 according to a column address.

During a read operation according to example embodiments of the inventive concepts, the cell data of the page buffer 12 are read by the ECC circuit 13, and the coefficients of the error locator polynomial are calculated by each sector unit. Also, according to the coefficients calculated by each sector unit and the column address signal including the position of an error bit, it is detected whether there is an error in the data of a bit that is indicated to have an error in typical data of 16 k bits. If there is an error, the error may be corrected and the corrected data may be stored in the buffer 14. The corrected data may be provided to the I/O pad 15.

During a program operation, the cell data of the page buffer 12 may be ready by the buffer 14. For example, the buffer 14 may configured with Static Random Access Memory (SRAM). The data of a bit whose position is marked by a column address among the cell data read by the buffer 14 may be replaced with information data of the I/O pad 15. Additionally, the ECC circuit 13 may calculate parity data corresponding to the data of one sector including the corrected data. Then, the data of 64sectors including the calculated parity data may be stored as code data in a page selected by the page buffer 12.

Figure 23:
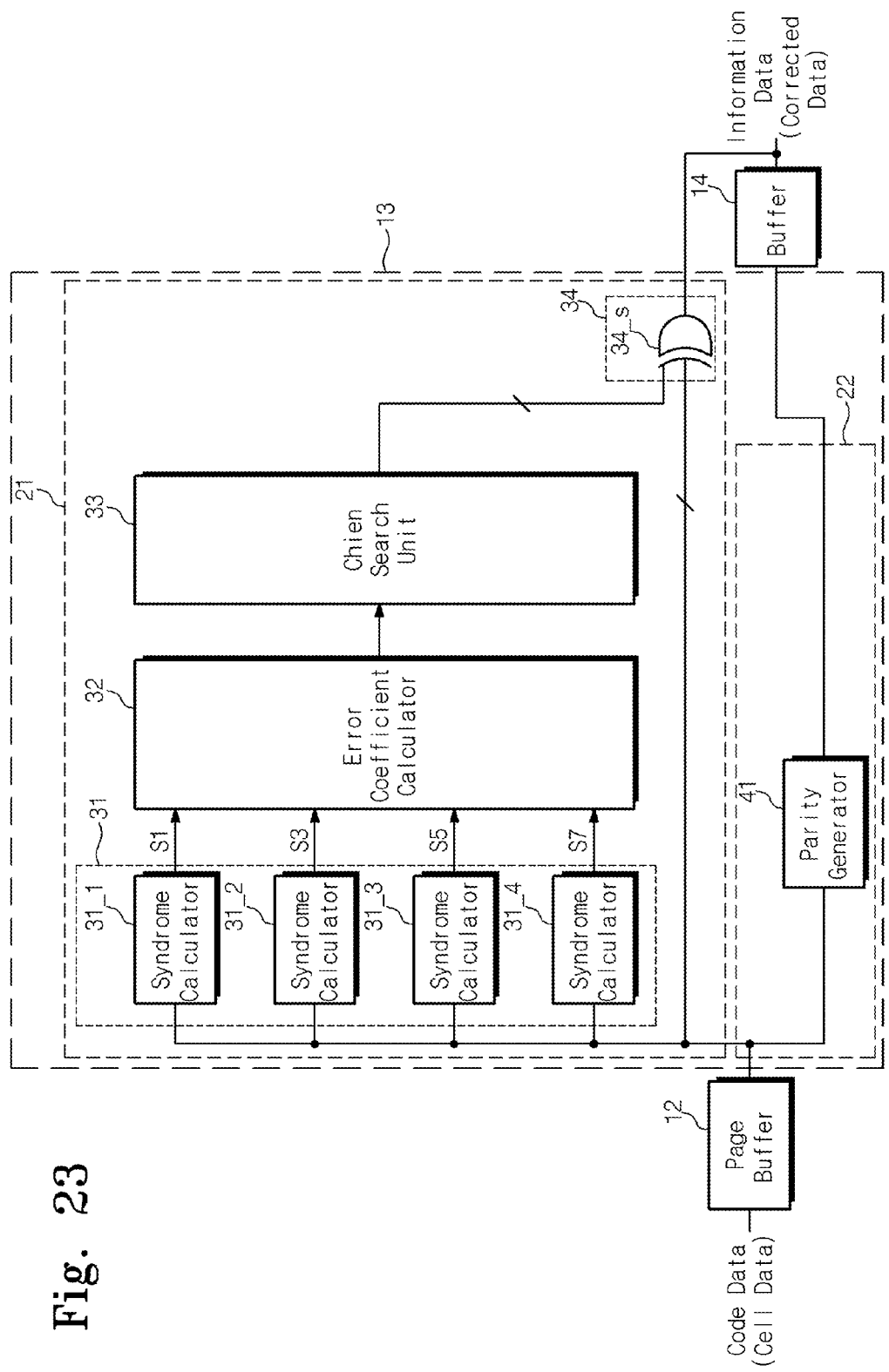
FIG. 23 is a block diagram illustrating other configuration of an ECC circuit of FIG. 1 according to example embodiments of the inventive concepts.

FIG. 23 is a block diagram illustrating other configuration of the ECC circuit 13 of FIG. 1. According to example embodiments of the inventive concepts, it is assumed that the ECC circuit 13 uses the BCH code that is one of block codes using Galois Field operation. However, instead of the BCH code, the hamming code or the Reed-Solomon code may be used. Then, the ECC circuit which sets information data of 32 bytes (=256 bits) (i.e., cell data corresponding to 1/64 of one page) as a correction unit and uses the BCH code capable of correcting 4-bit data in each correction unit will be described.

The ECC circuit 13 may include a decoder 21 and an encoder 22. The encoder 22 may include a parity generator 41. The parity generator 41 may divide the information data stored in the buffer 14 by a generation or, alternatively, generator polynomial to generate parity data. Additionally, the parity generator 41 may combine the generated parity data and the information data. The parity generator 41 may provide the information data including the parity data to the page buffer 12. Data provided to the page buffer 12 become code data that are stored in a selected page during a program operation of the nonvolatile semiconductor memory device 10. According to example embodiments of the inventive concepts, the ECC circuit 13 may correct data at high speed when data are read from the nonvolatile semiconductor memory device 10.

The decoder 21 may include a syndrome calculation circuit 31, an error coefficient calculator 32, a Chien search unit 33, and an error corrector 34. The cell data may be provided to the page buffer 12 during a read operation of the nonvolatile semiconductor memory device 10. Especially, the call data may be provided to each sector. The cell data provided to each sector may become code data. The syndrome calculation circuit 31 may divide the code data by independent minimal polynomials to calculate syndromes. When the BCH code capable of correcting a 4-bit error is used, the number of independent minimal polynomials is four. The syndrome calculation circuit 31 may include four syndrome calculators 31_1 to 31_4 corresponding to the four independent minimal polynomials, respectively. Each of the four syndrome calculators 31_1 to 31_4 may calculate the syndromes S1, S3, S5, and S7, respectively.

The error coefficient calculator 32 may calculate the coefficients $e_4$, $e_3$, $e_2$, $e_1$, and $e_0$ of the error locator polynomial with respect to each sector by using the calculated syndromes S1, S3, S5, and S7. The coefficients $e_4$, $e_3$, $e_2$, $e_1$, and $e_0$ are coefficients of the error locator polynomial $\Lambda(x)=e_4x^4+e_3x^3+e_2x^2+e_1x+e_0$. The error locator polynomial $\Lambda(x)$ may be used by the Chien search unit 33 that determines whether there is an error in the data of a bit read by each sector of the page buffer 12.

Figure 24:
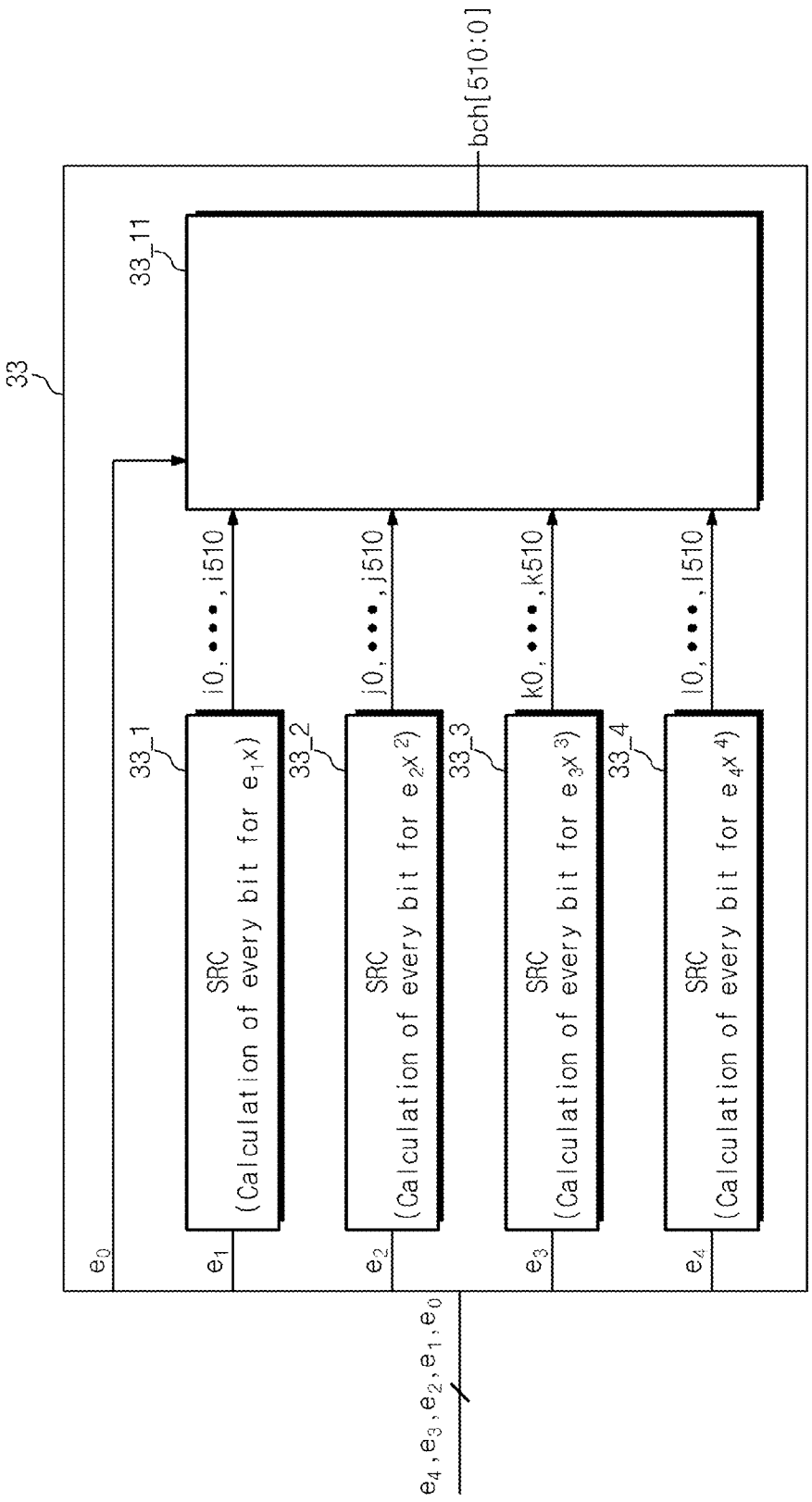
FIG. 24 is a block diagram illustrating a configuration of a Chien search unit of FIG. 23.

Referring to FIG. 24, a configuration and operation of the Chien search unit 24 will be described. FIG. 24 is a block diagram illustrating a configuration of the Chien search unit 33 of FIG. 23. The Chien search unit 33 may include four position search circuits 33_1 to 33_4 and an exclusive-or operation unit 33_11.

The four error location search circuits 33_1 to 33_4 may calculate $e_1x$, $e_2x^2$, $e_3x^3$, and $e_4x^4$, respectively. $x$ of $e_1x$, $e_2x^2$, $e_3x^3$, and $e_4x^4$ is a value indicating the position of a bit included in code data (i.e., cell data stored in the page buffer 12). $x$ may have one of 5119-bit elements of $\alpha^0$ to $\alpha^{510}$. Additionally, each of the coefficients $e_1$, $e_2$, $e_3$, and $e_4$ is a 9-bit vector provided from the error coefficient calculator 32.

The position search circuit 33_1 may receive the coefficient $e_1$ and multiply the coefficient $e_1$ and each of $\alpha^0$ to $\alpha^{510}$ to calculate i0 to i510. The position search circuit 33_2 may receive the coefficient $e_2$ and multiply the coefficient $e_2$ and each of $\alpha^0$ to $\alpha^{510}$ to calculate j0 to j510. The position search circuit 33_3 may receive the coefficient $e_3$ and multiply the coefficient $e_3$ and each of $\alpha^0$ to $\alpha^{510}$ to calculate k0 to k510. The position search circuit 33_4 may receive the coefficient $e_4$ and multiply the coefficient $e_4$ and each of $\alpha^0$ to $\alpha^{510}$ to calculate l0 to l510.

The exclusive-or operation unit 33_11 may perform exclusive-or operations on the coefficient $e_0$ and the calculation results of the four position search circuits 33_1, 33_2, 33_3, and 33_4. The exclusive-or operations may be performed on each of $\alpha^0$ to $\alpha^{510}$. For example, (i0+j0+k0+e0) may be calculated with respect to the element $\alpha_0$. The exclusive-or operation unit 33_11 may generate an error detection signal bch[510:0]) on the basis of the calculation result, and provide the generated error detection signal bch[510:0] to the error corrector 34. The exclusive-or operation unit 33_11 may substitute each of $\alpha^0$ to $\alpha^{510}$ to x of the error locator polynomial $\Lambda(x)=e_4x^4+e_3x^3+e_2x^2+e_1x^1+e_0$. For example, when a value of $\Lambda(x)$ is 0, the error detection signal bch[x] may have a value of logic 1. Also, when a value of $\Lambda(x)$ is not 0, the error detection signal bch[x] may have a value of logic 0.

According to example embodiments of the inventive concepts, the error corrector 34 may include 511 exclusive-or circuits 34_s (s is one of 0 to 510). When the error detection signal bch[s] has a value of logic 1, the exclusive-or circuit 34_s may invert a logic value of a bit at the position that the element $\alpha^s$ of the Galois Field $GF(2^9)$ indicates. Then, the exclusive-or circuit 34_s may store the inverted logic value in the buffer 14. The inverted logic value stored in the buffer 14 may correspond to one bit included in the corrected data.

However, when the error detect signal bch[s] has a value of logic 0, the exclusive-or circuit 34_s may not invert a logic value of a bit at the position that the element $\alpha^s$ of the Galois Field $GF(2^9)$ indicates, and may store the logic value in the buffer 14 as it is. The logic value stored in the buffer 14 may correspond to one bit included in the corrected data.

FIG. 25 is a block diagram illustrating a configuration of the position search circuits 33_1 to 33_4 of FIG. 24. Each of the position search circuits 33_1 to 33_4 may include a first vector generating circuit 33a for calculating multiplication of the coefficients of the error locator polynomial and each of the 9 elements of $\alpha^0$ to $\alpha^8$ whose only one bit has a value of logic 1. Also, each of the position search circuits 33_1 to 33_4 may include a second vector generating circuit 33b for calculating multiplication of the coefficients of the error locator polynomial and each of $\alpha^9$ to $\alpha^{510}$ which are the elements of the Galois Field GF($2^9$). The first vector generating circuit 33a may include the p generator 20 of FIGS. 21(2) and 9 selection circuits 80_0 to 80_8.

The p generator 20 may receive a coefficient vector $e_i$ expressed as ($e_{i8}$, $e_{i7}$, $e_{i6}$, $e_{i5}$, $e_{i4}$, $e_{i3}$, $e_{i2}$, $e_{i1}$, and $e_{i0}$) from the error coefficient calculator 32 to generate p0 to p7. p0 to p7 may be obtained by using the values of y[0] to y[8] and the logical expressions of FIG. 21(1). y[0] to y[8] may correspond to $e_{i0}$ to $e_{i8}$, respectively. The p generator 20 may provide the received $e_{i0}$ to $e_{i8}$ and the generated p0 to p7 to the selection circuits 80_0 to 80_8.

Each of the selection circuits 80_0 to 80_8 may select 9 values from $e_{i0}$ to $e_{i8}$ and p0 to p7, and output $e_i\alpha^0$ to $e_i\alpha^8$ according to binary values 9'b000000001, 9'b000000010, 9'b000000100, 9'b000001000, 9'b000010000, 9'b000100000, 9'b001000000, 9'b010000000, and 9'b100000000 that are preset to allow only one bit to have a value of logic 1. $e_i\alpha^0$ to $e_i\alpha^8$ may correspond to each bit of Z[8:0] in the case that y[0] to y[8] in the logical expressions of FIG. 20 are replaced with $e_{i0}$ to $e_{i8}$, respectively.

Each of the selection circuits 80_0 to 80_8 may select 9 values from $e_{i0}$ to $e_{i8}$ provided from the error coefficient calculator 32 and p0 to p7 provided from the p generator 20, according to the values that are preset to allow only one bit to have a value of logic 1. Accordingly, the selection circuits 80_0 to 80_8 do not require logical circuits such as exclusive-or circuits.

$e_i\alpha^0$ to $e_i\alpha^8$, each having 9 bits, may be provided to exclusive-or circuits of the exclusive-or operation unit 33_11 and exclusive-or circuits of the second vector generating circuit 33b. Accordingly, if lines are connected to allow output signals of the p generator 20 and output signals of the error coefficient calculator 32 to be inputted to predetermined exclusive-or circuits instead of using the selection circuits 80_0 to 80_8, the same result as the selection circuits 80_0 to 80_8 are used may be obtained.

The second vector generating circuit 33b may calculate multiplication of the coefficient $e_i$ and each of $\alpha^0$ to $\alpha^{510}$ which are the elements of the Galois Field GF($2^9$). The second vector generating circuit 33b may include 502(=511−9) exclusive-or circuits 85_i. Each exclusive-or circuits 85_i may calculate the sum of two values $e_i\alpha^p$ and $e_i\alpha^q$ among the multiplication of the coefficient $e_i$ of the error locator polynomial and each of 511 elements of $\alpha^0$ to $\alpha^{510}$. Each of $e_i\alpha^p$ and $e_i\alpha^q$ is a 9-bit value.

For example, multiplication of the coefficient $e_2$ of the error locator polynomial and each of 511 elements of $\alpha^0$ to $\alpha^{510}$ may be expressed as follows.

$$e_2(\alpha^0)^2 = e_2(\alpha^0),$$

$$e_2(\alpha^1)^2 = e_2(\alpha^2),$$

$$e_2(\alpha^2)^2 = e_2(\alpha^4),$$

$$e_2(\alpha^3)^2 = e_2(\alpha^6),$$

$$e_2(\alpha^4)^2 = e_2(\alpha^8),$$

$$e_2(\alpha^5)^2 = e_2(\alpha^{10}) = e_2(\alpha^5 + \alpha),$$

$$e_2(\alpha^6)^2 = e_2(\alpha^{12}) = e_2(\alpha^7 + \alpha^3),$$

$$e_2(\alpha^7)^2 = e_2(\alpha^{14}) = e_2(\alpha^5 + \alpha^4 + 1) = e_2(\alpha^5 + \alpha^9),$$

$$e_2(\alpha^8)^2 = e_2(\alpha^{16}) = e_2(\alpha^7 + \alpha^6 + \alpha^2) = e_2(\alpha^7 + \alpha^{11}),$$

...

The multiplication of the coefficient $e_2$ of error locator polynomial and each of 511 elements of $\alpha^0$ to $\alpha^{510}$ may be performed by the first vector generating circuit 33a or the second vector generating circuit 33b. Especially, $e_2(\alpha^0)^2$, $e_2(\alpha^1)^2$, $e_2(\alpha^2)^2$, $e_2(\alpha^3)^2$, and $e_2(\alpha^4)^2$ may be calculated by the first vector generating circuit 33a. The first vector generating circuit 33a may provide the calculation results of $e_2(\alpha^0)^2$, $e_2(\alpha^1)^2$, $e_2(\alpha^2)^2$, $e_2(\alpha^3)^2$, and $e_2(\alpha^4)^2$ to the second vector generating circuit 33b and the exclusive-or operation unit 33_11. $e_2(\alpha^0)^2$, $e_2(\alpha^1)^2$, $e_2(\alpha^2)^2$, $e_2(\alpha^3)^2$, and $e_2(\alpha^4)^2$ provided to the exclusive-or operation unit 33_11 correspond to j0, j1, j2, j3, and j4, respectively.

The second vector generating circuit 33b may calculate the sum of 9-bit values obtained by multiplying one of $\alpha^9$ to $\alpha^{510}$ which are the elements of the Galois Field GF($2^9$) and $e_2$. For example, in order to obtain $e_2(\alpha^5)^2$, $e_2\alpha^5 + e_2\alpha$ may be calculated. For example, $e_2(\alpha^5)^2$, $e_2(\alpha^6)^2$, $e_2(\alpha^7)^2$, and $e_2(\alpha^8)^2$ may be calculated by the second vector generating circuit 33b. The second vector generating circuit 33b may provide the calculation results of $e_2(\alpha^5)^2$, $e_2(\alpha^6)^2$, $e_2(\alpha^7)^2$, and $e_2(\alpha^8)^2$ to the second vector generating circuit 33b and the exclusive-or operation unit 33_11. $e_2(\alpha^5)^2$, $e_2(\alpha^6)^2$, $e_2(\alpha^7)^2$, and $e_2(\alpha^8)^2$ provided to the exclusive-or operation unit 33_11 correspond to j5, j6, j7, and j8, respectively.

The second vector generating circuit 33b may output 9-bit values obtained by multiplying at least two of $\alpha^9$ to $\alpha^{510}$ which are the elements of the Galois Field GF($2^9$) and the coefficient $e_i$. However, a value obtained by multiplying each of 502 elements except for the elements whose only one bit has a value of logic 1 and the coefficient $e_i$ of the error locator polynomial may be obtained by adding two values among the multiplication results of each of 511 elements including elements whose only one bit has a value of a logic 1 and the coefficient $e_i$ of the error locator polynomial. Therefore, the second vector generating circuit may perform calculations by using 4518(=502×9 bits) exclusive-or circuits.

According to example embodiments of the inventive concepts, ($2^m-1$) elements expressed as m-bit vectors on the Galois Field GF($2^m$) may be substituted to the error locator polynomial. According to example embodiments of the inventive concepts, the Chien search unit 33 may generate an error detection signal indicating whether there is an error in data of a bit in a position corresponding to each element of the Galois Field GF($2^m$). Each of the position search circuits 33_1 to 33_4 included in the Chien search unit 33 may substitute the elements of the Galois Field GF($2^m$) to each term of the error locator polynomial. In this case, the elements whose only one bit has a value of logic 1 may be provided to each of the position search circuits 33_1 to 33_4. Exclusive-or operations may be performed on i0 to i510, j0 to j510, k0 to k510, and l0 to l510, which are the calculation results of the position search circuits 33_1 to 33_4. The exclusive-or operation unit 33_11 may generate the error detection signal bch[510:0] by using exclusive-or operations.

Each of the position search circuits 33_1 to 33_4 may include the first vector generating circuit 33a and the second vector generating circuit 33b. The first vector generating circuit 33a may calculate multiplication of m-bit coefficients vectors $e_1$ to $e_4$ of the error locator polynomial and vectors 9'b000000001 to 9'b100000000 representing m-bit elements whose only one bit has a value of logic 1. On the basis of the multiplication results, the first vector generating circuit 33a may generate m first vectors. The first vector generating circuit 33a may include m bit determination units (e.g., the selection circuits 80_0 to 80_8 or direct line connections) for generating the first vectors in parallel from each bit of the coefficient vector or combination of the each bit. The first vectors may be generated based on the position of a bit having a value of logic 1 in the vector representing an element whose only one bit has a value of logic 1.

The second vector generating circuit 33b may generate ($2^m-1-m$) second vectors expressed as the sum of at least two of the first vectors. The second vector generating circuit 33b may include exclusive-or circuits for generating the second vectors obtained by the sum of two of the first vectors and the second vectors.

According to example embodiments of the inventive concepts, multiplication of the 9 elements whose only one bit has a value of logic 1 and the coefficient vectors of the error locator polynomial may be calculated by 8 exclusive-or circuits of the first vector generating circuit 33a. Moreover, multiplication of the 502 elements except for the elements whose only one bit has a value of logic 1 and the coefficient vectors of the error locator polynomial may be calculated by 9×502 exclusive-or circuits of the second vector generating circuit 33b. For example, each of the position search circuits 33_1 to 33_4 may be configured with 4526(=8+9×502) exclusive-or circuits. Accordingly, the four position search circuits may be configured with 18104 (=4526×4) logical circuits.

Additionally, the exclusive-or operation unit 33_11 in the Chien search unit 33 may calculate the sum of outputs (9 bits×511) of each of the four position search circuits 33_1 to 33_4 to generate the error detection signal. Therefore, the exclusive-or operation unit 33_11 may require 18396 (=4×9×511) exclusive-or circuits. Accordingly, the Chien search unit 33 may require 36824(=18428+18396) logical circuits.

Compared to the Chien search unit 339 of the related art requiring 353612 logical circuits, the Chien search unit according to example embodiments of the inventive concepts may require logical circuits whose number is reduced to 1/10. Therefore, according to other embodiments of the inventive concepts, the scale of the error location search circuit may be reduced, and the ECC circuit and the memory device including the error location search circuit of which scale is reduced may be obtained.

According to example embodiments of the inventive concepts, a bit string may be commonly provided to each of a plurality of Chien search circuits disposed in a matrix along a column direction and a row direction. Accordingly, lines for providing a signal that represents a bit position need not be connected to each of the plurality of Chien search circuits. As a result, the number of lines for providing a signal that represents a bit position to each of the plurality of Chien search circuit may be reduced, and also the scale of a Chien search circuit may be reduced. Additionally, since the plurality of Chien search circuits may be disposed appropriately and integrally, the entire circuit scale may be effectively reduced.

According to example embodiments of the inventive concepts, by using elements whose only one bit has a value of logic 1 among elements of the Galois Field, the other elements of the Galois Field are expressed. According to example embodiments of the inventive concepts, the number of logic circuits in an error location search circuit may be drastically reduced. Therefore, according to example embodiments of the inventive concepts, the scale of the error location search circuit may be reduced, and an ECC circuit and a memory device including the error location search circuit having reduced scale may be obtained.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An error check and correction (ECC) circuit comprising:
a Chien search unit configured to use an arbitrary element of Galois Field $GF(2^n)$ as a substitution value of an error locator polynomial and determine whether there is an error in each bit of a data string, the Chien search unit including,
a calculator circuit configured to calculate a first bit string by multiplying a plurality of first elements of the Galois Field $GF(2^n)$ and a reference (n-k)-bit value, and configured to calculate a second bit string by multiplying the plurality of first elements of the Galois Field $GF(2^n)$ and a reference k-bit value, 'n' and 'k' being positive integers, 'k' being less than 'n'; and
a plurality of Chien search circuits configured to combine the first bit string and the second bit string to calculate the arbitrary element, and configured to substitute the calculated arbitrary element into the error locator polynomial,
wherein the Chien search unit is configured such that,
the plurality of Chien search circuits are arranged in a matrix along a row direction and a column direction,
the first bit string is provided in the row direction or the column direction, and the second bit string is provided in a direction different from a direction in which the first bit string is provided among the row direction and the column direction, and
bits used as elements of the Galois Field $GF(2^n)$ and bits not used as elements of the Galois Field $GF(2^n)$ are rearranged in a bit space configured with a matrix of the first bit string and the second bit string.

2. The ECC circuit of claim 1, wherein the Chien search unit is configured such that a number of the plurality of Chien search circuits is equal to or greater than a number of bits in the data string.

3. A memory device comprising:
a memory cell;
the ECC circuit of claim 1; and
a data storage unit configured to temporarily store the data string, and configured to provide the data string to the ECC circuit.

4. The memory device of claim 3, wherein the Chien search unit is configured such that a number of the plurality of Chien search circuits is equal to or greater than a number of bits in the data string.

5. An error check and correction (ECC) circuit comprising:
a data storage unit storing a data string;
a syndrome calculation unit configured to calculate a syndrome based on the data string;
an error coefficient calculation unit configured to calculate a coefficient of an error locator polynomial by using the syndrome;

an error location search circuit configured to substitute $(2^m-1)$ elements expressed as an m-bit vector on Galois Field $GF(2^m)$ into the error locator polynomial, and configured to generate an error detection signal indicating whether there is an error in a bit in a position corresponding to each of the elements among data, m being a positive integer; and an error correction unit configured to correct a value of an error bit in the data string according to the error detection signal, and configured to output the corrected data string, wherein the error location search circuit includes,
- a plurality of position search circuits configured to,
  - receive the elements, respectively,
  - substitute the received elements into each term of the error locator polynomial, and
  - multiply coefficients of the error locator polynomial and the received elements to calculate output values; and
- an exclusive-or operation unit configured to perform an exclusive-or operation corresponding to each of the elements on the output values calculated by the plurality of position search circuits, and
- wherein the error location search circuit is configured such that the error detection signal is generated based on a result of the exclusive-or operation.

6. The ECC circuit of claim 5, wherein each of the plurality of position search circuits comprises:
- a first vector generating circuit configured to generate m first vectors, based on an m-bit coefficient vector configured by coefficients of the error locator polynomial and an m-bit fixed vector corresponding to an element having only one bit with a value of logic 1; and
- a second vector generating circuit configured to generate $(2^m-1-m)$ second vectors obtained by a sum of at least two vectors among vectors corresponding to the first vectors,
- wherein the first vector generating circuit includes m bit determination units configured to generate the first vectors in parallel from each bit of the coefficient vector or a combination of each bit of the coefficient vector according to a position of a bit having a value of logic 1 in the fixed vector, and
- wherein the second vector generating circuit includes an exclusive-or circuit configured to generate the second vectors by a sum of two vectors among vectors corresponding to the first vectors and corresponding to the second vectors.

7. A memory device comprising:
the ECC circuit of claim 5,
wherein the data storage unit is a circuit configured to store a data string read from a storage device, and
wherein each of the elements corresponds to a column address indicating a position of a memory string of the storage device.

8. The memory device of claim 7, wherein each of the plurality of position search circuits comprises:
- a first vector generating circuit configured to generate m first vectors, based on an m-bit coefficient vector configured by coefficients of the error locator polynomial and an m-bit fixed vector corresponding to an element having only one bit with a value of logic 1; and
- a second vector generating circuit configured to generate $(2^m-1-m)$ second vectors obtained by a sum of at least two vectors among vectors corresponding to the first vectors,
- wherein the first vector generating circuit includes m bit determination units configured to generate the first vectors in parallel from each bit of the coefficient vector or a combination of each bit of the coefficient vector according to a position of a bit having a value of logic 1 in the fixed vector, and
- wherein the second vector generating circuit includes an exclusive-or circuit configured to generate the second vectors by a sum of two vectors among vectors corresponding to the first vectors and corresponding to the second vectors.

* * * * *